United States Patent
Kim et al.

(10) Patent No.: US 10,890,761 B2
(45) Date of Patent: Jan. 12, 2021

(54) PHOTOREACTIVE SENSOR INCLUDING OPTICAL AMPLIFICATION PHOTOTRANSISTOR, AND DISPLAY PANEL AND VEHICLE CONTROL SYSTEM INCLUDING PHOTOREACTIVE SENSOR

(71) Applicant: UNIVERSITY-INDUSTRY COOPERATION GROUP OF KYUNG HEE UNIVERSITY, Yongin-si (KR)

(72) Inventors: Sun Kook Kim, Yongin-si (KR); Seong In Hong, Namyangju-si (KR); Young Ki Hong, Seoul (KR); Dong Han Kim, Seoul (KR)

(73) Assignee: UNIVERSITY-INDUSTRY COOPERATION GROUP OF KYUNG HEE UNIVERSITY, Yongin-si (KR)

( * ) Notice: Subject to any disclaimer, the term of this patent is extended or adjusted under 35 U.S.C. 154(b) by 0 days.

(21) Appl. No.: 15/568,988

(22) PCT Filed: Dec. 16, 2015

(86) PCT No.: PCT/KR2015/013821
§ 371 (c)(1),
(2) Date: Oct. 24, 2017

(87) PCT Pub. No.: WO2016/171369
PCT Pub. Date: Oct. 27, 2016

(65) Prior Publication Data
US 2018/0129043 A1    May 10, 2018

(30) Foreign Application Priority Data

Apr. 24, 2015 (KR) .................. 10-2015-0058012
Jun. 22, 2015 (KR) .................. 10-2015-0088126
Jun. 29, 2015 (KR) .................. 10-2015-0092248

(51) Int. Cl.
*G06F 3/041* (2006.01)
*G02B 27/01* (2006.01)
(Continued)

(52) U.S. Cl.
CPC ............. *G02B 27/01* (2013.01); *G06F 3/042* (2013.01); *G06F 3/0416* (2013.01); *G06K 9/001* (2013.01);
(Continued)

(58) Field of Classification Search
CPC .............. G06F 3/041; G06F 3/044; G06F 2203/04103; G06F 3/017; G06F 3/0416; G02B 27/01
See application file for complete search history.

(56) References Cited

U.S. PATENT DOCUMENTS 5,726,443 A * 3/1998 Immega ............... G01S 17/026
                                                          250/208.1
6,709,901 B1 * 3/2004 Yamazaki ........... G02F 1/13452
                                                          349/56
(Continued)

FOREIGN PATENT DOCUMENTS

JP    2009-010348 A    1/2009
JP    2011-203660 A    10/2011
(Continued)

OTHER PUBLICATIONS

Notice of Allowance for corresponding KR 10-2015-0058012, dated Mar. 27, 2017.
(Continued)

*Primary Examiner* — Olga V Merkoulova
(74) *Attorney, Agent, or Firm* — Sughrue Mion, PLLC

(57) ABSTRACT

Disclosed is a photoreactive sensor including an optical amplification phototransistor, in which a non-overlapping
(Continued)

region that does not overlap with a local gate electrode between a source electrode and a drain electrode is formed and which senses an optical image through the non-overlapping region for amplify photoconductivity; and a contact light emitting device that is formed on the optical amplification phototransistor and generates the optical image corresponding to a contacted surface upon contact with an object.

19 Claims, 29 Drawing Sheets

(51) Int. Cl.
| | |
|---|---|
| *H01L 31/10* | (2006.01) |
| *G06F 3/042* | (2006.01) |
| *H01L 31/09* | (2006.01) |
| *G06K 9/00* | (2006.01) |
| *H01L 31/0224* | (2006.01) |
| *H01L 31/112* | (2006.01) |

(52) U.S. Cl.
CPC ......... *G06K 9/0004* (2013.01); *G06K 9/0008* (2013.01); *H01L 31/022466* (2013.01); *H01L 31/09* (2013.01); *H01L 31/10* (2013.01); *H01L 31/112* (2013.01); *B60K 2370/1438* (2019.05); *B60K 2370/33* (2019.05)

(56) References Cited

U.S. PATENT DOCUMENTS

| | | | | |
|---|---|---|---|---|
| 7,750,422 | B2* | 7/2010 | Watanabe | H01L 27/14643 257/431 |
| 9,608,009 | B2* | 3/2017 | Park | H01L 27/1225 |
| 9,893,102 | B2* | 2/2018 | Raguin | H01L 27/14601 |
| 10,163,984 | B1* | 12/2018 | Ho | H01L 27/3216 |
| 2004/0252867 | A1* | 12/2004 | Lan | G06K 9/0004 382/124 |
| 2007/0073156 | A1 | 3/2007 | Zilberman et al. | |
| 2007/0194379 | A1* | 8/2007 | Hosono | H01L 21/02631 257/347 |
| 2008/0203425 | A1* | 8/2008 | Sulima | H01L 31/03046 257/185 |
| 2009/0243019 | A1* | 10/2009 | Kawai | H01L 31/03529 257/440 |
| 2010/0065844 | A1* | 3/2010 | Tokunaga | H01L 23/564 257/43 |
| 2011/0024751 | A1* | 2/2011 | Yamazaki | H01L 27/1225 257/57 |
| 2013/0038209 | A1* | 2/2013 | Akasaka | G01J 1/4204 315/77 |
| 2013/0313621 | A1* | 11/2013 | Yamada | H01L 27/146 257/292 |
| 2014/0131698 | A1* | 5/2014 | Kim | H01L 29/78681 257/42 |
| 2014/0319317 | A1* | 10/2014 | Lai | H01L 49/00 250/200 |
| 2015/0263052 | A1* | 9/2015 | Yamazaki | H01L 27/14616 257/43 |

FOREIGN PATENT DOCUMENTS

| | | |
|---|---|---|
| KR | 10-2003-0078371 A | 10/2003 |
| KR | 10-2004-0022632 A | 3/2004 |
| KR | 10-0436376 B1 | 6/2004 |
| KR | 10-2005-0113693 A | 12/2005 |
| KR | 10-0905571 B1 | 7/2009 |
| KR | 10-2011-0087051 A | 8/2011 |
| KR | 10-2013-0108631 A | 10/2013 |
| KR | 10-2014-0006487 A | 1/2014 |
| KR | 10-2014-0037702 A | 3/2014 |
| KR | 10-2014-0047989 A | 4/2014 |
| KR | 10-1376732 B1 | 4/2014 |
| KR | 10-1381169 B1 | 4/2014 |
| KR | 10-1458699 B1 | 11/2014 |

OTHER PUBLICATIONS

Notice of Allowance for corresponding KR 10-2015-0088126, dated Apr. 29, 2016.
Notice of Allowance for corresponding KR 10-2015-0092248, dated Nov. 17, 2016.
Written Opinion for PCT/KR2015/013821, dated Mar. 31, 2016.
International Search Report for PCT/KR2015/013821, dated Mar. 31, 2016.

* cited by examiner

PHOTOREACTIVE SENSOR INCLUDING OPTICAL AMPLIFICATION PHOTOTRANSISTOR, AND DISPLAY PANEL AND VEHICLE CONTROL SYSTEM INCLUDING PHOTOREACTIVE SENSOR

CROSS REFERENCE TO RELATED APPLICATIONS

This application is a National Stage of International Application No. PCT/KR2015/013821 filed Dec. 16, 2015, claiming priority based on Korean Patent Application No. 10-2015-0058012 filed Apr. 24, 2015, 10-2015-0088126 filed Jun. 22, 2015, 10-2015-0092248 filed Jun. 29, 2015, the contents of all of which are incorporated herein by reference in their entirety.

TECHNICAL FIELD

The present invention relates to a photoreactive sensor, and a display panel and vehicle control system including the photoreactive sensor, more particularly to a display panel and vehicle control system implemented by an optical amplification-based photoreactive sensor that analyzes or displays photoreactive information including at least one of fingerprint information, contact information, and biometric information of a target subject based on the degree of light reactivity.

CROSS-REFERENCE TO RELATED APPLICATIONS

This application claims priority to and the benefit of Korean Patent Application No. 10-2015-0058012, filed on Apr. 24, 2015, Korean Patent Application No. 10-2015-0088126, filed on Jun. 22, 2015, and Korean Patent Application No. 10-2015-0092248, filed on Jun. 29, 2015. Each of the above applications is hereby expressly incorporated by reference, in its entirety, into the present application.

BACKGROUND ART

Recently, research on flexible displays, transparent displays, 3D displays, and high-resolution displays, as next generation displays, is actively underway. To realize such next generation displays, a thin film transistor (TFT) using amorphous silicon (a-Si) or low temperature polysilicon (LTPS) as a channel material is currently used. However, such TFTs exhibit problems due to mechanical deformation of a flexible substrate during high-temperature deposition. In addition, upon bending of a flexible substrate to which the TFTs are applied, the flexible substrate is easily cracked, is opaque, and, as the largest disadvantage, exhibits a material mobility of 30 $cm^2$/Vsec or less. Accordingly, a flexible substrate to which the TFTs are applied has great limitations in realizing high resolution.

Transistors serving as switches in electronic circuits are key elements in the electronics industry and are used in a variety of products such as computers, cell phones, LCDs, and OLED flat panel displays. In particular, thin film transistors using amorphous silicon or polycrystalline silicon are mainly used for flat panel displays, but amorphous silicon has a low mobility (<1 $cm^2$/Vs) and polycrystalline silicon has a disadvantage that it is difficult to realize a large area.

Display operation speed is closely related to the mobility of a transistor. To realize a high-definition flat panel display and a flexible display in the future, a semiconductor material with a high speed (mobility of about 50 $cm^2$/Vs) and low power consumption is required. For this purpose, research into transistors using oxide semiconductors and the like is actively underway, but mobility (about 10 $cm^2$/Vs) and power consumption do not meet the demands of the industry.

Graphene, in which carbon atoms are arranged in a hexagonal honeycomb, is a typical two-dimensional material and has received great attention due to remarkable properties thereof. Graphene is over 200 times stronger than steel, more than twice as thermally conductive as diamond, over 100 times electricity than copper, and has over 100 times the electron mobility of silicon.

The mechanical, thermal, and electrical properties of graphene are caused by the electronic structure of graphene wherein an energy bandgap is absent. However, paradoxically, graphene excluding an energy bandgap exhibits semi-metallic properties rather than semiconductor properties, which is a major barrier in commercializing into a transistor as a core element of the electronics industry.

Accordingly, research into graphene nanoribbons or graphene layers capable of forming an energy bandgap in graphene for application thereof to a transistor has been actively conducted. However, a bandgap of only about 0.4 eV is possible, and, when a bandgap is formed, mobility is rapidly decreased. Therefore, there are limitations in practically applying graphene nanoribbons or graphene layers.

To overcome these problems, many researchers have started to pay attention to two-dimensional materials other than graphene. Thereamong, interest in transition metal chalcogen compounds such as molybdenum disulfide ($MoS_2$) is rapidly increasing in recent years. Transition metal chalcogen compounds are represented by formula $MX_2$, wherein M is a transition metal element (group 4 to 6 of the periodic table) and X is a chalcogen element (S, Se, and Te in group 7 of the periodic table).

Such transition metal chalcogen compounds have a layered structure similar to graphite, and are maintained by Van der Waals bonds wherein an X-M-X layer consisting of covalent bonds is loose. Research into the transition metal chalcogen compounds is being actively conducted for application to transistors.

Meanwhile, using touch recognition sensor technology, the position of a character displayed on a display or a specific position can be sensed by touching the position or the specific position without using a keyboard, and information contained in the character or the specific position can be recognized.

In addition, the touch recognition sensor technology can be used in the security field to identify fingerprints and identify their identity.

In general, a contact recognition sensor may include a contact light emitting device generating a visible image; and an optical amplification phototransistor sensing an optical image.

More particularly, a contact light emitting device can generate an optical image corresponding to the contact surface of an object (e.g., user's finger, etc.) when the object contacts the contact light emitting device, and an optical amplification phototransistor can sense the optical image generated from the contact light emitting device.

As an optical amplification phototransistor sensing an optical image, a thin film transistor using amorphous silicon or polycrystalline silicon is mainly used. However, amorphous silicon has low mobility (<1 $cm^2$/Vs), and polycrystalline silicon is disadvantageous in realizing a large area.

Accordingly, to address such problems, many researchers have started to pay attention to various other materials.

Thereamong, interest in transition metal chalcogen compounds such as molybdenum disulfide ($MoS_2$) is rapidly increasing in recent years. Transition metal chalcogen compounds are represented by formula $MX^2$, wherein M is a transition metal element (group 4 to 6 of the periodic table) and X is a chalcogen element (S, Se, and Te in group 7 of the periodic table).

Such transition metal chalcogen compounds have a layered structure similar to graphite, and are maintained by Van der Waals bonds wherein an X-M-X layer consisting of covalent bonds is loose. Research into the transition metal chalcogen compounds is being actively conducted for application to a transistor.

Such transition metal chalcogen compounds have a different bandgap depending upon the number of layers. A transition metal chalcogen compound composed of a single layer has a direct transition bandgap, and a transition metal chalcogen compound composed of multiple layers (two layers or more) has an indirect transition bandgap. A multilayer transition metal chalcogen compound having an indirect transition bandgap has a physically low photoreactivity (~100 $mAW^{-1}$), thereby having low applicability to various optical devices.

In recent years, input devices (a button, a switch, a wheel, etc.) located on a front or side surface of an existing display panel have been replaced by an input device such as a touchscreen.

For example, a display panel includes a near IR touch sensor with a large area structure including a silicon germanium (SiGe) and silicon (Si)-based phototransistor so as to overcome large area deposition limitation of a transparent electrode such as a transparent electrode formed of Indium Tin Oxide (ITO).

Here, existing phototransistors may sense contact with a target object, such as a user's finger and an object (e.g., a touch pen, etc.), may sense a fingerprint of a target object, and may include an amorphous silicon material or a polycrystalline silicon material.

However, an amorphous silicon material included in existing phototransistors sensing light has low mobility (<1 cm/Vs), and a polycrystalline silicon material included therein is disadvantageous in realizing a large area.

In addition, technology for detecting biometric information of a user and displaying the detected biometric information, such as a thermal imaging camera sensor, has been developed in recent years.

For example, technology for detecting biometric information of a user is characterized by wearing a device including a sensor for detecting biometric information on the user's body or wearing a clothing device including a plurality of sensors attached thereto to detect biometric information.

However, although the technology for detecting biometric information of a user employs a method that is accurate and avoids pain for a user when used in monitoring using an infrared thermal imaging camera sensor, it has limitations in that user cost is high and the user should always stand in front of a camera. Accordingly, except for special cases, there are difficulties in clinically using the technology.

DISCLOSURE

Technical Problem

Therefore, the present invention has been made in view of the above problems, and it is one object of the present invention to provide a photoreactive sensor amplifying photoconductivity through a channel region that is formed of a transition metal chalcogen compound and includes a local gate electrode and a non-overlapping region, so as to address low photoreactivity of a semiconductor material having indirect transition and improve contact recognition.

It is another object of the present invention to provide a photoreactive sensor capable of providing high transparency, high mobility, and high reliability to a transparent electronic device by forming a gate electrode, a source electrode, and a drain electrode with a transparent material and forming a channel region with a transition metal chalcogen compound.

It is another object of the present invention to provide a low-cost interactive display panel by inserting an optical amplification phototransistor into a backplane structure including a switching transistor and a driving transistor distinguishing active coordinates of each pixel.

It is another object of the present invention to provide an integrated display panel providing a simplified structure by integrally generating a light source for outputting image information and a light source for obtaining photoreactive information.

It is another object of the present invention to provide a highly sensitive display panel increasing a sensing recognition rate for sensing light reflected from a target subject by separately generating a light source for obtaining photoreactive information in a photoreactive region.

It is another object of the present invention to provide an energy-efficient display panel capable of reducing power consumption by using a target subject as the ground of a power source to generate light.

It is another object of the present invention to provide a composite display panel that senses light reflected from a target subject to amplify photoreactivity, senses photoreactive information including at least one of fingerprint information, contact information, and biometric information of a target subject based on an amplified photoreactivity degree, and displays the sensed photoreactive information to a user.

It is another object of the present invention to provide a display panel that amplifies optical gain and photoreactivity due to inclusion of a non-overlapping region, which operates as a photoconductor of a channel region that does not overlap with a local gate electrode, and an optical amplification phototransistor, which operates as a photoconductor amplifying photoconductivity.

It is another object of the present invention to provide a display panel providing high transparency, high mobility, and high reliability to a transparent electronic device using an optical amplification phototransistor that uses a transition metal chalcogen compound as a material of a channel region.

It is yet another object of the present invention to provide a vehicle control system for preventing vehicle theft and driver errors by generating a control command for controlling a vehicle by analyzing obtained photoreactive information and providing the generated control command to an electronic unit that performs an operation in response to the generated control command, and a method of operating the vehicle control system.

Technical Solution

In accordance with an aspect of the present invention, the above and other objects can be accomplished by the provision of a photoreactive sensor including an optical amplification phototransistor, in which a non-overlapping region that does not overlap with a local gate electrode between a source electrode and a drain electrode is formed and which senses an optical image through the non-overlapping region for amplify photoconductivity; and a contact light emitting device that is formed on the optical amplification phototransistor and generates the optical image corresponding to a contacted surface upon contact with an object.

The contact light emitting device may include a transparent electrode layer connected to one terminal of a power source; a light emitting layer that is formed on the transparent electrode layer and generates the optical image corresponding to the contacted surface upon contact with an object forming a ground; and a dielectric layer formed on the light emitting layer.

The non-overlapping region may be formed in a lateral direction of each of the source electrode and the drain electrode or in a lateral direction of any one of the source electrode and the drain electrode.

The channel region may be formed of a transition metal chalcogen compound (transition metal dichalcogenide).

The transition metal chalcogen compound may include at least one of molybdenum disulfide ($MoS_2$), molybdenum diselenide ($MoSe_2$), tungsten diselenide ($WSe_2$), molybdenum ditelluride ($MoTe_2$), and tin diselenide ($SnSe_2$).

Each of the gate electrode, the source electrode, and the drain electrode may include at least one of metallic materials and transparent conductive materials, wherein the transparent conductive material includes at least one of an amorphous oxide, a crystalline oxide, graphene, and a polymeric organic substance.

In accordance with an aspect of the present invention, the optical amplification phototransistor may include a lower local gate electrode formed on a substrate; a gate insulating layer formed on the substrate to cover the lower local gate electrode; the source electrode and the drain electrode respectively formed at opposite sides of the gate insulating layer; and the channel region including the gate insulating layer and a non-overlapping region, wherein the non-overlapping region is formed between the source electrode and the drain electrode and does not overlap with the lower local gate electrode.

In accordance with another aspect of the present invention, the optical amplification phototransistor may include a channel region that is formed on an insulating layer and includes the non-overlapping region; an upper local gate electrode that is formed by interposing a gate insulating layer on the channel region and does not overlap with the non-overlapping region; and the source and drain electrodes that are formed on the insulating layer and are connected to each other by the channel region.

The present invention provides a low-cost interactive display panel by inserting an optical amplification phototransistor into a backplane structure including a switching transistor and a driving transistor distinguishing active coordinates of each pixel.

The present invention provides an integrated display panel providing a simplified structure by integrally generating a light source for outputting image information and a light source for obtaining photoreactive information.

The present invention provides a highly sensitive display panel increasing a sensing recognition rate for sensing light reflected from a target subject by separately generating a light source for obtaining photoreactive information in a photoreactive region.

The present invention provides an energy-efficient display panel capable of reducing power consumption by using a target subject as the ground of a power source to generate light.

The present invention provides a composite display panel that senses light reflected from a target subject to amplify photoreactivity, senses photoreactive information including at least one of fingerprint information, contact information, and biometric information of a target subject based on an amplified photoreactivity degree, and displays the sensed photoreactive information to a user.

The present invention provides a display panel that amplifies optical gain and photoreactivity due to inclusion of a non-overlapping region, which operates as a photoconductor of a channel region that does not overlap with a local gate electrode, and an optical amplification phototransistor, which operates as a photoconductor amplifying photoconductivity.

The present invention provides a display panel providing high transparency, high mobility, and high reliability to a transparent electronic device using an optical amplification phototransistor that uses a transition metal chalcogen compound as a material of a channel region.

A display panel according to a first embodiment of the present invention includes a light source part generating light; a switching transistor sampling image information corresponding to each pixel; a first storage capacitor storing the image information; a driving transistor switching current supply to the light source part by reference voltage of the stored image information; an optical amplification phototransistor that transmits the switched current supply to the light source part, and senses light generated from the light source part and reflected from a target subject to amplify photoreactivity; and a second storage capacitor that stores photoreactive information including at least one of fingerprint information, contact information, and biometric information of the target subject based on a reactivity degree of the amplified light.

The light source part may be formed on a lower part of a backplane based on a backlight method, and may include at least one of a halogen, a Quantum Dot (QD), a light emitting diode (LED), and an Organic Light Emitting Diode (OLED) illuminant.

A gate and a drain of the switching transistor may be respectively connected to a scan line and a data line, a gate of the driving transistor may be connected to a source of the switching transistor, the first storage capacitor may be connected in parallel with a gate and a source of the driving transistor, a source and a drain of the optical amplification phototransistor may be respectively connected to the driving transistor, and a second storage capacitor connected in parallel with the light source part.

The optical amplification phototransistor may include a channel region including a non-overlapping region that is disposed between a source electrode and a drain electrode and does not overlap with a local gate electrode, and may sense the reflected light through the non-overlapping region that amplifies photoconductivity.

The non-overlapping region may be formed in a lateral direction of each of the source electrode and the drain electrode or in a lateral direction of any one of the source electrode and the drain electrode.

The channel region may be formed of at least one material of a transition metal chalcogen compound (transition metal dichalcogenide), silicon (Si), an oxide semiconductor, an organic semiconductor, and semiconductors of III-V compounds.

Each of the gate electrode, the source electrode, and the drain electrode may include at least one of metallic materials and transparent conductive materials, wherein the transparent conductive material includes at least one of an amorphous oxide, a crystalline oxide, graphene, and a polymeric organic substance.

In accordance with an embodiment, the optical amplification phototransistor may include a lower local gate electrode formed on a substrate; a gate insulating layer formed on the substrate to cover the lower local gate electrode; the source electrode and the drain electrode respectively formed at opposite sides of the gate insulating layer; and the channel region including the gate insulating layer and a non-overlapping region, wherein the non-overlapping region is formed between the source electrode and the drain electrode and does not overlap with the lower local gate electrode.

In accordance with another embodiment, the optical amplification phototransistor may include a channel region that is formed on an insulating layer and includes the non-overlapping region; an upper local gate electrode that is formed by interposing a gate insulating layer on the channel region and does not overlap with the non-overlapping region; and the source and drain electrodes that are formed on the insulating layer and are connected to each other by the channel region.

The biometric information may include information on a tissue or a function related to at least any one of melanin pigment concentration, hemoglobin concentration, pulse and an oxygen saturation degree, and information on a tissue and a function related to at least any one of temperature and humidity of a skin tissue.

A display panel according to a second embodiment of the present invention may include a light source part that generates light to acquire photoreactive information including at least one of fingerprint information, contact information, and biometric information of a target subject; a switching transistor that samples image information corresponding to each pixel; a first storage capacitor that stores the image information; a driving transistor that switches current supply to an illuminant by reference voltage of the stored image information; an optical amplification phototransistor that transmits the switched current supply to the illuminant, and senses light generated from the light source part and reflected from the target subject to amplify photoreactivity; and a second storage capacitor that stores the photoreactive information based on a reactivity degree of the amplified light.

The light source part may generate the light radiated to a photoreactive region, and the optical amplification phototransistor may sense the light reflected from the target object located on the photoreactive region.

The illuminant may be formed on a lower part of a backplane based on a backlight method, and may include at least one of a halogen, a Quantum Dot (QD), a light emitting diode (LED), and an Organic Light Emitting Diode (OLED).

A display panel according to a third embodiment of the present invention includes a light source part that includes a transparent electrode layer connected to one terminal of a power source; a light emitting layer that is formed on the transparent electrode layer and generates light to correspond the contacted surface upon contact with a target subject forming a ground; and a dielectric layer formed on the light emitting layer; and a photoreactive sensor that includes a switching transistor sampling image information corresponding to each pixel; a first storage capacitor storing the image information; a driving transistor switching current supply to the light source part by reference voltage of the stored image information; an optical amplification phototransistor that transmits the switched current supply, and senses light generated from the light source part and reflected from the target subject to amplify photoreactivity; and a second storage capacitor that stores photoreactive information including at least one of fingerprint information, contact information, and biometric information of the target subject based on a reactivity degree of the amplified light.

A vehicle control system according to an embodiment of the present invention includes an acquisition part that senses and amplifies light reflected from a target object based on an optical amplification phototransistor formed on at least one of a door, a trunk, a handle, a display, a start button, a smart key, and a predetermined position of a vehicle, and acquires photoreactive information including at least one of fingerprint information, contact information, and biometric information of the target object based on a reactivity degree of the amplified light; a control command generator that generates a control command by analyzing the acquired photoreactive information; and a controller that controls generation of the control command and controls an electronic unit performing an operation corresponding to the generated control command.

The optical amplification phototransistor may be disposed between a source electrode and a drain electrode, may include a channel region including a non-overlapping region not overlapping with a local gate electrode, and may sense the reflected light through the non-overlapping region amplifying photoconductivity.

The non-overlapping region may be formed in a lateral direction of each of the source electrode and the drain electrode or in a lateral direction of any one of the source electrode and the drain electrode.

The channel region may be formed of at least one material of a transition metal chalcogen compound (transition metal dichalcogenide), silicon (Si), an oxide semiconductor, an organic semiconductor, and semiconductors of III-V compounds.

Each of the gate electrode, the source electrode, and the drain electrode may include at least one of metallic materials and transparent conductive materials, wherein the transparent conductive material includes at least one of an amorphous oxide, a crystalline oxide, graphene, and a polymeric organic substance.

In accordance with an aspect of the present invention, the optical amplification phototransistor may include a lower local gate electrode formed on a substrate; a gate insulating layer formed on the substrate to cover the lower local gate electrode; the source electrode and the drain electrode respectively formed at opposite sides of the gate insulating layer; and the channel region including the gate insulating layer and a non-overlapping region, wherein the non-overlapping region is formed between the source electrode and the drain electrode and does not overlap with the lower local gate electrode.

In accordance with another aspect of the present invention, the optical amplification phototransistor may include a channel region that is formed on an insulating layer and includes the non-overlapping region; an upper local gate electrode that is formed by interposing a gate insulating layer on the channel region and does not overlap with the non-overlapping region; and the source and drain electrodes that are formed on the insulating layer and are connected to each other by the channel region.

The acquisition part may include a light source part that generates light; a switching transistor that samples image information corresponding to each pixel; a first storage capacitor that stores the image information; a driving transistor that switches current supply to at least one of the light source part and an illuminant by reference voltage of the stored image information; the optical amplification phototransistor that transmits the switched current supply to at least one of the light source part and the illuminant, and senses light generated from the light source part and reflected from the target object to amplify photoreactivity; and a second storage capacitor that acquires the photoreactive information on the amplified light.

At least one of the light source part and the illuminant may be formed on a lower part of a backplane based on a backlight method, and may include at least one of a halogen, a Quantum Dot (QD), a light emitting diode (LED), and an Organic Light Emitting Diode (OLED).

A gate and a drain of the switching transistor may be respectively connected to a scan line and a data line, a gate of the driving transistor may be connected to a source of the switching transistor, the first storage capacitor may be connected in parallel with a gate and a source of the driving transistor, a source and a drain of the optical amplification phototransistor may be respectively connected to the driving transistor, and a second storage capacitor connected in parallel with the light source part.

In accordance with an embodiment, the light source part may generate light radiated to a photoreactive region when the current supply to the illuminant is switched, and the optical amplification phototransistor may sense the light reflected from the target object located on the photoreactive region to amplify the photoreactivity.

In addition, the light source part may include a transparent electrode layer that is connected to one terminal of a power source; a light emitting layer that is formed on the transparent electrode layer and generates light to correspond to the contacted surface upon contact of the target object forming a ground; and a dielectric layer that is formed on the light emitting layer.

The biometric information may include information on a tissue or a function related to at least any one of melanin pigment concentration, hemoglobin concentration, pulse and an oxygen saturation degree, and information on a tissue and a function related to at least any one of temperature and humidity of a skin tissue.

In accordance with an embodiment, the control command generator may determine whether a driver matches a registered driver a registered driver by analyzing the acquired photoreactive information and may generate a control command corresponding the determination result.

In addition, the control command generator may determine whether driving is possible by analyzing the acquired photoreactive information and may generate a control command corresponding the determination result.

In addition, the control command generator may generate a control command to display the biometric information on the display.

A method of operating a vehicle control system according to an embodiment of the present invention includes a step of sensing and amplifying light reflected from a target object based on an optical amplification phototransistor formed on at least one of a door, a trunk, a handle, a display, a start button, a smart key, and a predetermined position of a vehicle, and acquiring photoreactive information including at least one of fingerprint information, contact information, and biometric information of the target object based on a reactivity degree of the amplified light; a step of generating a control command by analyzing the acquired photoreactive information; and a step of providing the generated control command to an electronic unit that performs an operation to correspond to the generated control command.

Advantageous Effects

The present invention may provide a photoreactive sensor amplifying photoconductivity through a channel region that is formed of a transition metal chalcogen compound and includes a local gate electrode and a non-overlapping region, so as to address low photoreactivity of a semiconductor material having indirect transition and improve contact recognition.

In addition, the present invention may provide a photoreactive sensor capable of providing high transparency, high mobility, and high reliability to a transparent electronic device by forming a gate electrode, a source electrode, and a drain electrode with a transparent material and forming a channel region with a transition metal chalcogen compound.

The present invention may provide a low-cost interactive display panel by inserting an optical amplification phototransistor into a backplane structure including a switching transistor and a driving transistor distinguishing active coordinates of each pixel.

The present invention may provide an integrated display panel providing a simplified structure by integrally generating a light source for outputting image information and a light source for obtaining photoreactive information.

The present invention may increase a sensing recognition rate for sensing light reflected from a target subject by separately generating a light source for obtaining photoreactive information in a photoreactive region.

The present invention may reduce power consumption by creating a target subject with ground of a power source to generate light.

The present invention may sense light reflected from a target subject on a display panel to amplify photoreactivity, may sense photoreactive information including at least one of fingerprint information, contact information, and biometric information of a target subject based on an amplified photoreactivity degree, and may display the sensed photoreactive information to a user.

The present invention may amplify optical gain and photoreactivity due to inclusion of a non-overlapping region, which operates as a photoconductor of a channel region that does not overlap with a local gate electrode, and an optical amplification phototransistor, which operates as a photoconductor amplifying photoconductivity.

The present invention may provide high transparency, high mobility, and high reliability to a transparent electronic device using an optical amplification phototransistor that uses a transition metal chalcogen compound as a material of a channel region.

The present invention may prevent vehicle theft and driver errors by generating a control command for controlling a vehicle by analyzing obtained photoreactive information and providing the generated control command to an electronic unit that performs an operation in response to the generated control command.

BEST MODE

Figure 1:
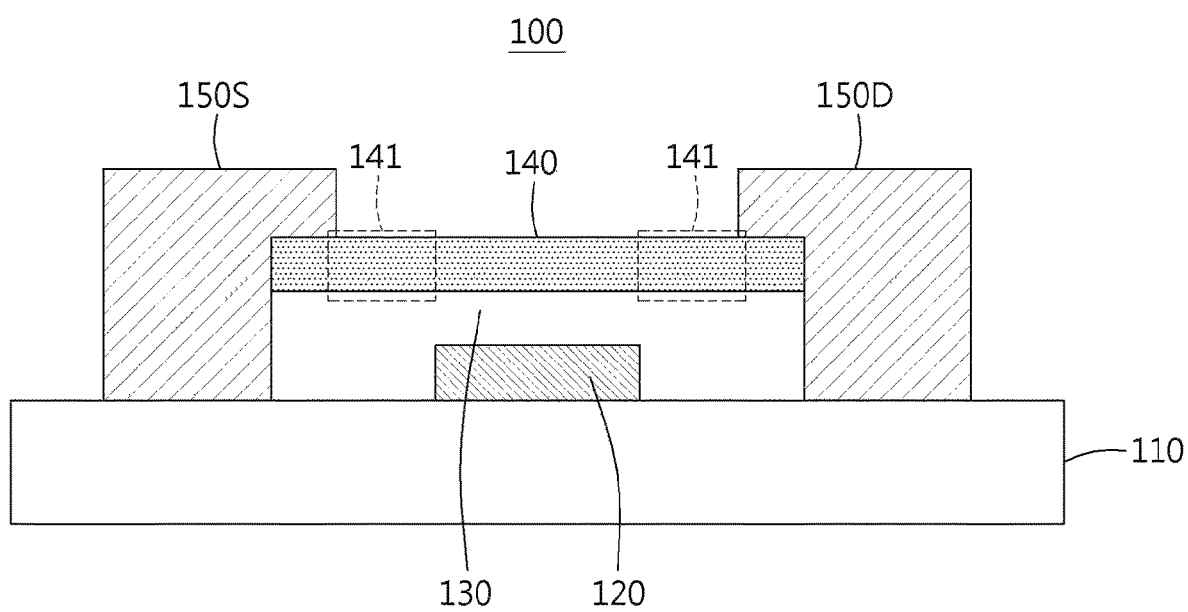
FIG. 1 illustrates an optical amplification phototransistor having a local bottom gate structure according to an embodiment of the present invention.

Hereinafter, the embodiments of the present invention are described with reference to the accompanying drawings and the description thereof but are not limited thereto.

When an element or a layer is referred to as being "on" another element or another layer, the element or the layer can be directly on another element or another layer or an intervening element or layer can be present. On the other hand, when an element or a layer is referred to as being "directly on" another element or another layer, an intervening element or layer is not present.

Spatially-relative terms such as "below", "beneath", "lower", "above", or "upper" may be used herein to describe one element's relationship to another element as illustrated in the Figures. It will be understood that spatially-relative terms are intended to encompass different orientations of the device in addition to the orientation depicted in the Figures. For example, if the device in one of the figures is turned over, elements described as "below" or "beneath" other elements would then be oriented "above" the other elements. The exemplary terms "below" or "beneath" can, therefore, encompass both an orientation of above and below. Since the device may be oriented in another direction, the spatially-relative terms may be interpreted in accordance with the orientation of the device.

The terminology used in the present disclosure is for the purpose of describing particular embodiments only and is not intended to limit the disclosure. As used in the disclosure and the appended claims, the singular forms "a", "an" and "the" are intended to include the plural forms as well, unless context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Meanwhile, in the following description of the present invention, a detailed description of known functions and configurations incorporated herein will be omitted when it may make the subject matter of the present invention unclear. The terms used in the specification are defined in consideration of functions used in the present invention, and can be changed according to the intent or conventionally used methods of clients, operators, and users. Accordingly, definitions of the terms should be understood on the basis of the entire description of the present specification.

Figure 2:
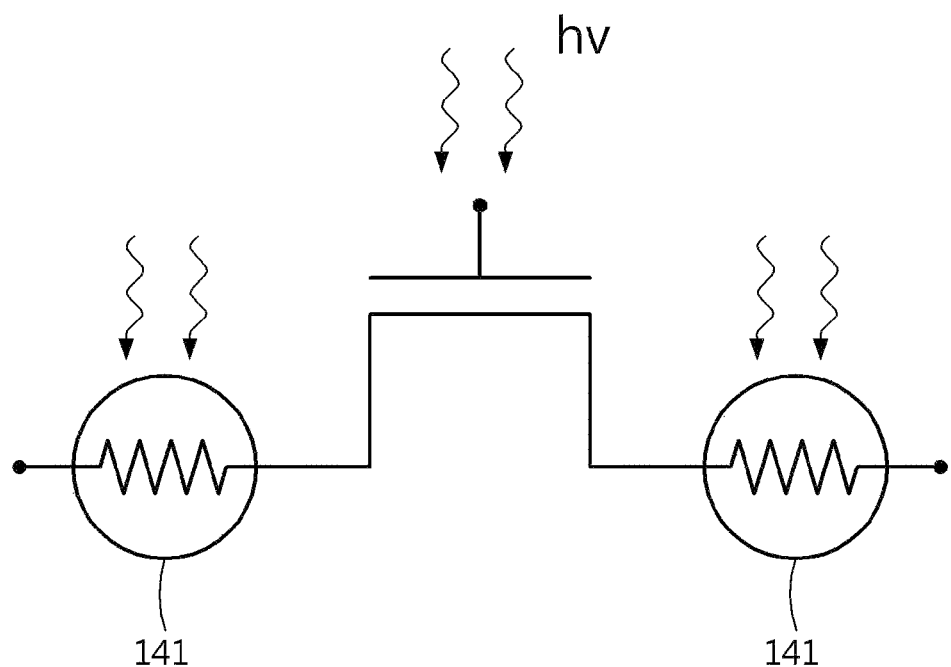
FIG. 2 illustrates a circuit diagram of the optical amplification phototransistor having the local bottom gate structure according to an embodiment of the present invention.

FIG. 1 illustrates an optical amplification phototransistor having a local bottom gate structure according to an embodiment of the present invention, and FIG. 2 illustrates a circuit diagram of the optical amplification phototransistor having the local bottom gate structure according to an embodiment of the present invention.

Referring to FIG. 1, an optical amplification phototransistor 100 may include a lower local gate electrode 120 formed on a substrate 110; a gate insulating layer 130 covering the lower local gate electrode 120; source electrodes 150S and 150D respectively formed at opposite sides of the gate insulating layer 130; and a channel region 140 that is formed on the gate insulating layer 130 and causes channel formation between the source electrodes 150S and 150D.

The lower local gate electrode 120 may be formed on the substrate 110, and the gate insulating layer 130 may be formed on the substrate 110 to cover the lower local gate electrode 120.

The source electrodes 150S and 150D may be respectively formed at opposite sides of the gate insulating layer 130.

The lower local gate electrode 120, and the source and drain electrodes 150S and 150D may be formed of any one material of metallic materials and transparent conductive materials. The metallic material may be any one of Au, Ti, Al, and Pd, but the present invention is not limited thereto and metallic materials useable in the art to which the present invention pertains are preferred. In addition, the transparent conductive material may be at least one material of an amorphous oxide, a crystalline oxide, graphene, and a polymeric organic substance.

In accordance with an embodiment, each of the lower local gate electrode 120 and the source electrodes 150S and 150D may be formed of a transparent conductive material. Here, the transparent conductive material may be indium zinc oxide (IZO), indium tin oxide (ITO), graphene.

The channel region 140 is formed on the gate insulating layer 130, a channel is formed between the source electrodes 150S and 150D, and non-overlapping regions 141 that do not overlap with the lower local gate electrode 120 are included.

As illustrated in FIG. 2, when light is not applied to the non-overlapping regions 141 of the optical amplification phototransistor 100, the non-overlapping regions 141 function as an external series resistor although a bias is applied to a gate electrode. However, when light is applied to the non-overlapping regions 141, the non-overlapping regions 141 may function a photoconductor for amplifying photoconductivity because resistance is decreased and conductivity increases.

The channel region 140 may be formed of a transition metal chalcogen compound (2D transition metal dichalcogenide). Here, the transition metal chalcogen compound may be composed of a single layer or multiple layers.

Since it is relatively easy to fabricate a complex structure with a two-dimensional material compared to a one-dimensional material, a two-dimensional material is suitable as a material of next-generation nanoelectronic devices. A two-dimensional transition metal chalcogen compound (2D transition metal dichalcogenide) among two-dimensional materials may be at least any one of molybdenum disulfide ($MoS_2$), molybdenum diselenide ($MoSe_2$), tungsten diselenide ($WSe_2$), molybdenum ditelluride ($MoTe_2$), and tin diselenide ($SnSe_2$).

In FIG. 2, the non-overlapping regions 141 of the optical amplification phototransistor 100 are illustrated as being respectively formed in a lateral direction of each of the source electrode 150S and the drain electrode 150D. However, the present invention is not limited thereto, and the non-overlapping regions 141 of the optical amplification phototransistor 100 may be formed in a lateral direction of any one of the source electrode 150S and the drain electrode 150D.

Figure 3:
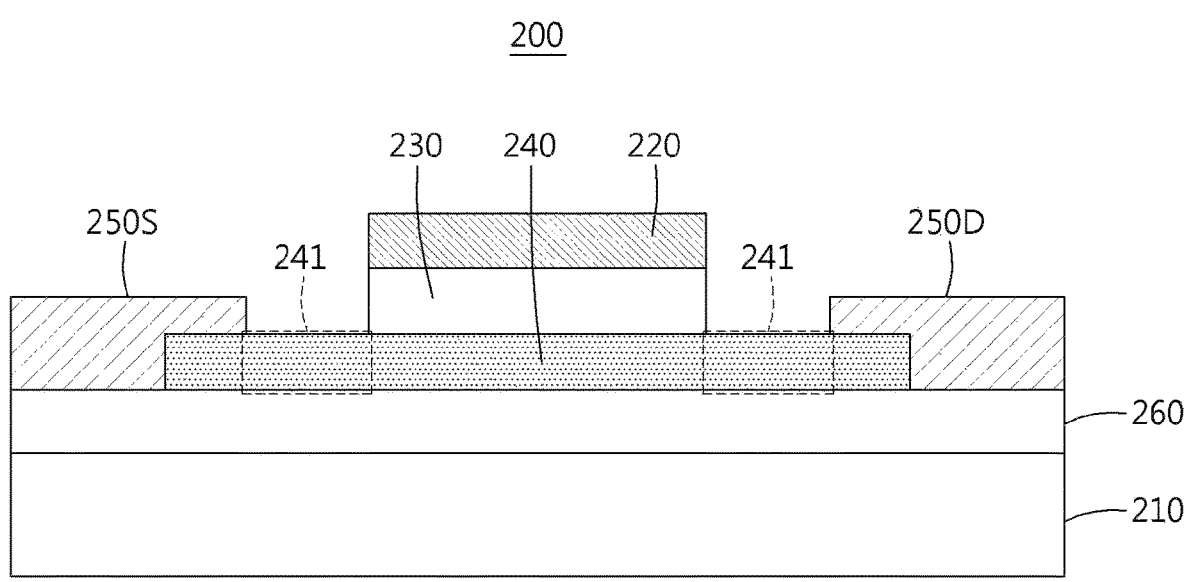
FIG. 3 illustrates an optical amplification phototransistor having a local top gate structure according to an embodiment of the present invention.

FIG. 3 illustrates an optical amplification phototransistor having a local top gate structure according to an embodiment of the present invention.

Referring to FIG. 3, an optical amplification phototransistor 200 may include a channel region 240 formed on an insulating layer 260; an upper local gate electrode 220, a gate insulating layer 230 being disposed between the upper local gate electrode 220 and the channel region 240; and source and drain electrodes 250S and 250D that are formed on the insulating layer 260 and are connected to each other by the channel region 240.

Here, the insulating layer 260 may be formed on a substrate 210, and the source and drain electrodes 250S and 250D may be respectively formed at opposite sides of the gate insulating layer 230.

The upper local gate electrode 220 and the source and drain electrodes 250S and 250D may be formed of any one material of metallic materials and transparent conductive materials. The metallic material may be any one of Au, Ti, Al, and Pd, but the present invention is not limited thereto and metallic materials useable in the art to which the present invention pertains are preferred. In addition, the transparent conductive material may be at least one material of an amorphous oxide, a crystalline oxide, graphene, and a polymeric organic substance In accordance with an embodiment, the upper local gate electrode 220 and the source and drain electrodes 250S and 250D may be formed of a transparent conductive material. Here, the transparent conductive material may be IZO, ITO, or graphene.

The channel region 240 includes non-overlapping regions 241 that do not overlap with the gate electrode 220 corresponding to the channel region 240. In addition, as described above, the non-overlapping regions 241 operate as photoconductors for amplifying photoconductivity with reference to FIG. 3.

In addition, as described above, the channel region 240 may be formed of a transition metal chalcogen compound composed of a single layer or multiple layers. Here, the transition metal chalcogen compound may be at least any one compound of molybdenum disulfide, molybdenum diselenide, tungsten diselenide, molybdenum ditelluride, and tin diselenide.

In FIG. 3, the non-overlapping regions 241 of the optical amplification phototransistor 200 are illustrated as being respectively formed in a lateral direction of each of the source electrode 250S and the drain electrode 250D. However, the present invention is not limited thereto, and the non-overlapping regions 241 of the optical amplification phototransistor 200 may be formed in a lateral direction of any one of the source electrode 250S and the drain electrode 250D.

Figure 4:
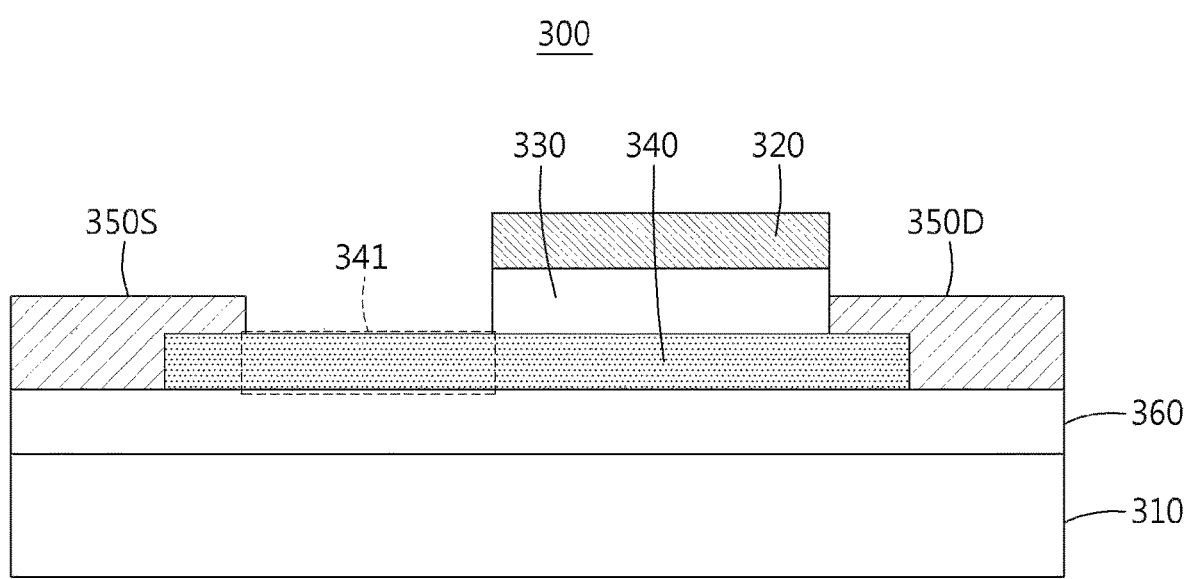
FIG. 4 illustrates a case wherein a non-overlapping region 341 of an optical amplification phototransistor 300 is formed in a lateral direction of a source electrode (350D).

FIG. 4 illustrates a case wherein a non-overlapping region 341 of an optical amplification phototransistor 300 is formed in a lateral direction of a source electrode 350S.

Referring to FIG. 4, a non-overlapping region 341 of an optical amplification phototransistor 300 may be formed in a lateral direction of any one of source and drain electrodes 350S and 350D, or may be formed in a lateral direction of each of the source and drain electrodes 350S and 350D.

Hereinafter, a difference between a monolayer transition metal chalcogen compound and a multilayer transition metal chalcogen compound is described with reference to FIGS. 5 to 9.

Figure 5:
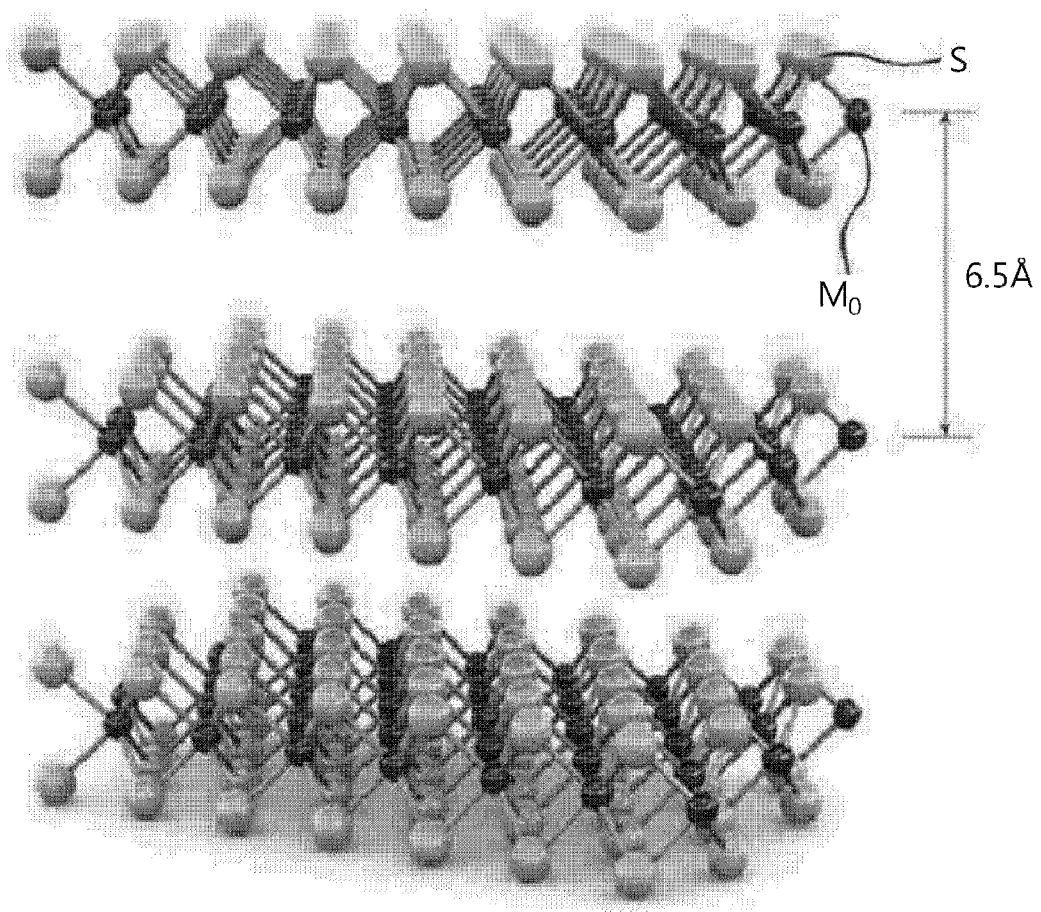
FIG. 5 illustrates a single layer structure of molybdenum disulfide ($MoS_2$) among transition metal chalcogen compounds.
Figure 6:
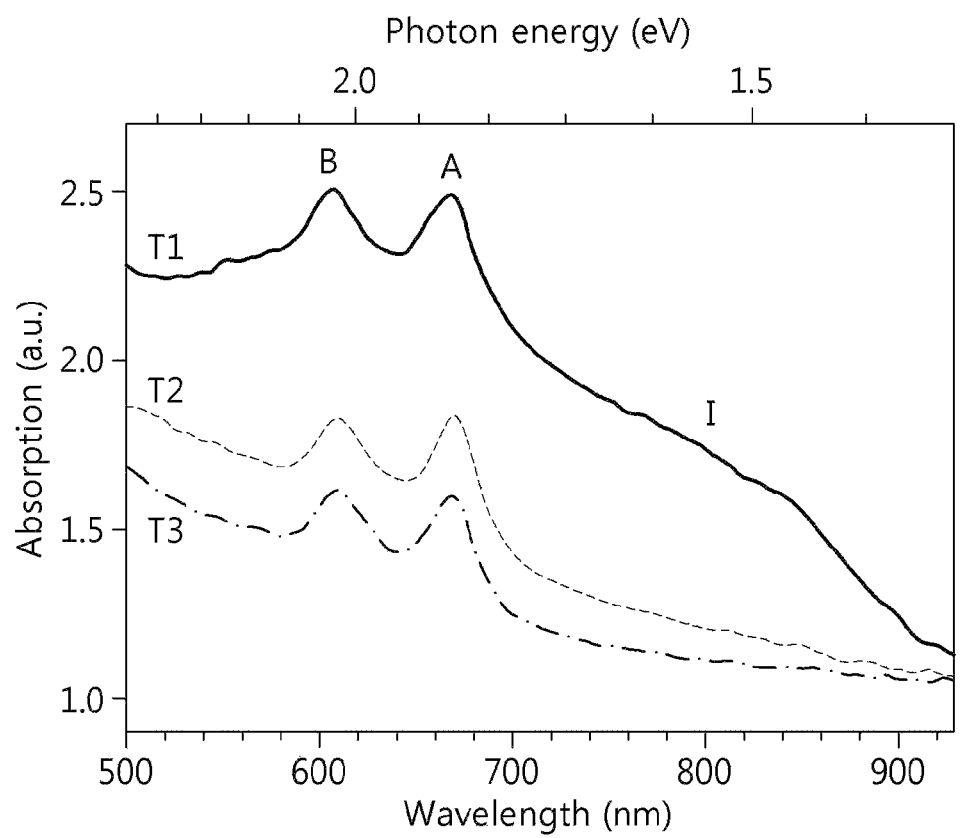
FIG. 6 illustrates absorption spectra of $MoS_2$ crystals having different thicknesses.
Figure 7:
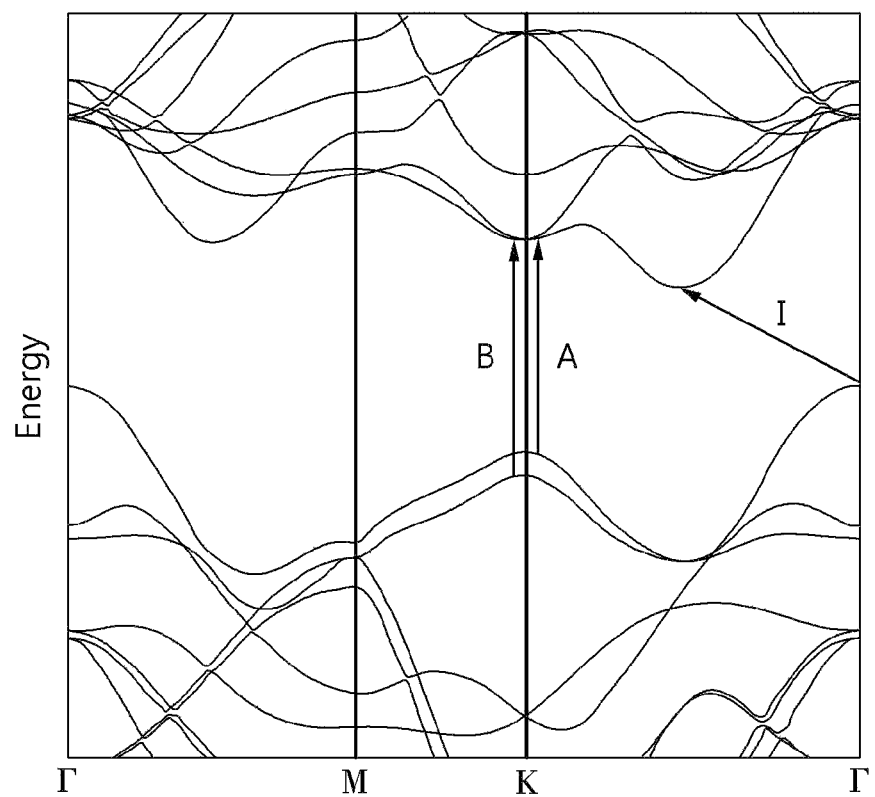
FIG. 7 illustrates a band structure of bulk $MoS_2$.
Figure 8:
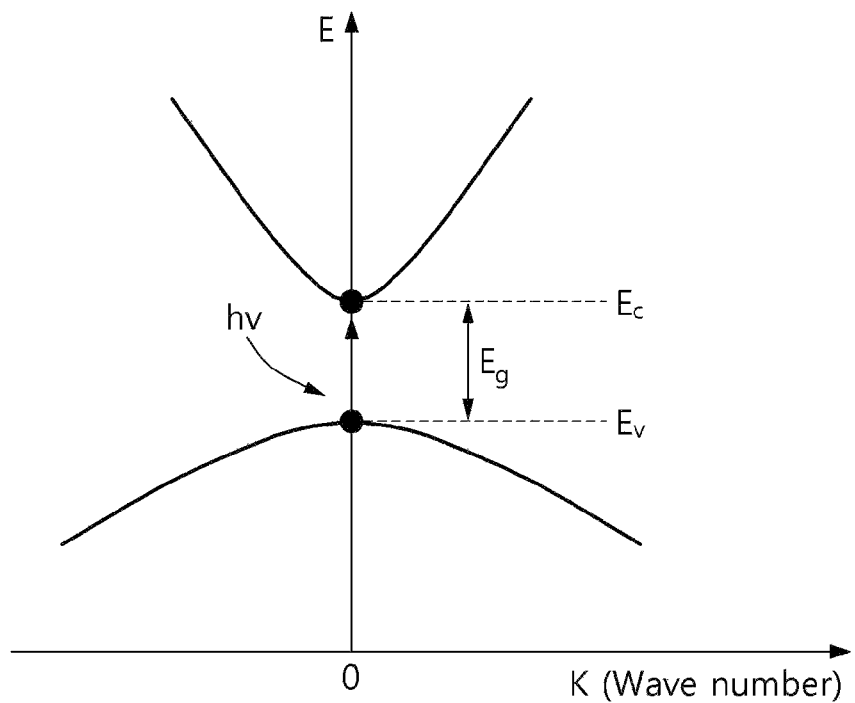
FIG. 8 illustrates an E-k graph of a direct transition bandgap.
Figure 9:
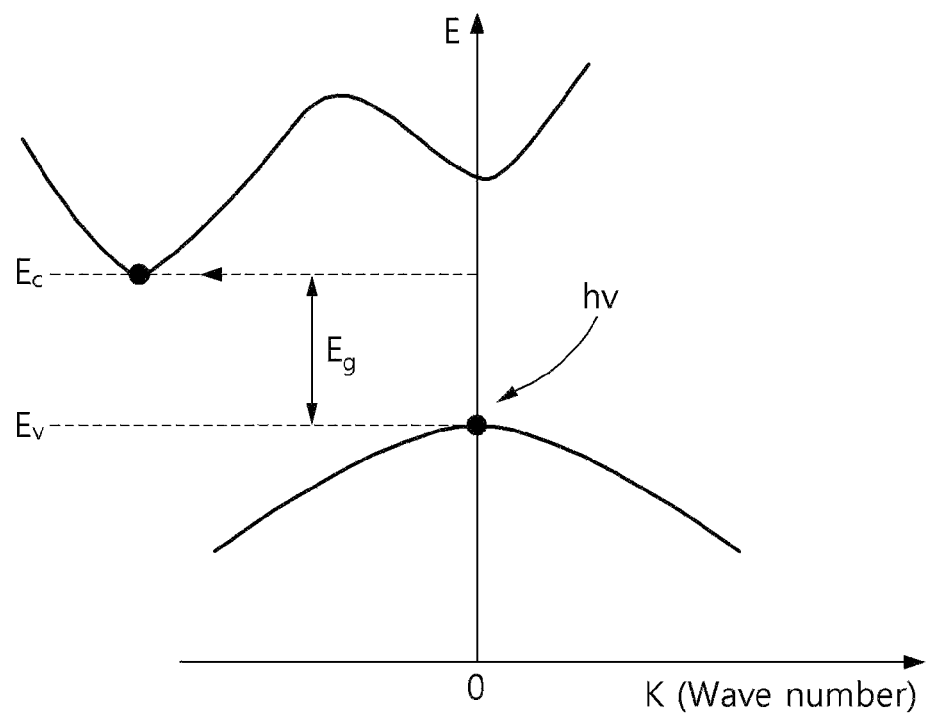
FIG. 9 illustrates an E-k graph of an indirect transition bandgap.

FIG. 5 illustrates a single layer structure of molybdenum disulfide ($MoS_2$) among transition metal chalcogen compounds, FIG. 6 illustrates absorption spectra of $MoS_2$ crystals having different thicknesses, FIG. 7 illustrates a band structure of bulk $MoS_2$, FIG. 8 illustrates an E-k graph of a direct transition bandgap, and FIG. 9 illustrates an E-k graph of an indirect transition bandgap.

Referring to FIG. 5, monolayer $MoS_2$ crystals are vertically stacked, the thickness of a single layer thereof is 6.5 Å, and layers thereof are formed by van der Waals interaction.

A monolayer $MoS_2$ has an intrinsic bandgap of 1.8 eV, but has very low mobility of 0.5 to 3 cm $V^{-1}$ $s^{-1}$. In addition, when compared to mobility value of graphene or thin-film silicon, a monolayer $MoS_2$ tends to exhibit mobility that is reduced with increasing bandgap.

Referring to FIG. 6, T1, T2 and T3 represent the thicknesses of $MoS_2$ crystals. The thickness order is T1>T2>T3. Particularly, T1 is about 40 nm, T2 is about 4 nm, and T3 is about 1 nm. As illustrated in FIG. 5, the monolayer $MoS_2$ may absorb wavelengths of below about 700 nm.

Referring to FIG. 7, absorption peaks "A" and "B" correspond to direct transition bandgaps energy-separated from valance band spin-orbit coupling, and tail "I" corresponds to an indirect transition bandgap.

Meanwhile, referring to FIG. 8, a direct transition bandgap illustrates a case wherein energy Ev(k) of a valence band occurs at a wave number k equal to energy Ec(k) of a conduction band, and FIG. 9 illustrates an indirect transition bandgap wherein the two energy types occur at different wave numbers.

In the case of the direct transition bandgap of FIG. 8, valence electrons directly transition to a conduction band by optical radiation energy (hv). On the other hand, in the case of the indirect transition bandgap of FIG. 9, valence electrons indirectly transit to a conduction band 에 transition and, in this case, a phonon Eph is generated.

In the direct transition bandgap, optical radiation energy is as follows: hv=Eg. On the other hand, in the indirect transition bandgap, optical radiation energy is as follows: hv=Eg+Eph. As such, Eph occurs in the indirect transition bandgap, whereby an energy gap in the direct transition bandgap is decreased from 1.8 eV (monolayer $MoS_2$) to 1.35 eV (multilayer $MoS_2$).

When an energy gap is decreased from 1.8 eV to 1.35 eV, a wavelength value is changed according to the following Equation 1:

$$\lambda = \frac{1.24}{E_g}$$ [Equation 1]

When an energy gap is 1.35 eV instead of 1.8 eV, i.e., in the case of a small bandgap, a wavelength (λ) increases. That is, it can be observed from T1, T2, and T3 graphs of FIG. 6 that, when the multilayer $MoS_2$ is used, a wider wavelength range may be absorbed, compared to the case in which the monolayer $MoS_2$ is used.

In other words, while wavelengths of below 700 nm may be absorbed in the case of the monolayer $MoS_2$, all wavelengths below 1000 nm may be absorbed in the case of the multilayer $MoS_2$ according to the present invention. This indicates that a wavelength range of near IR to ultraviolet may be detected.

Figure 10A:
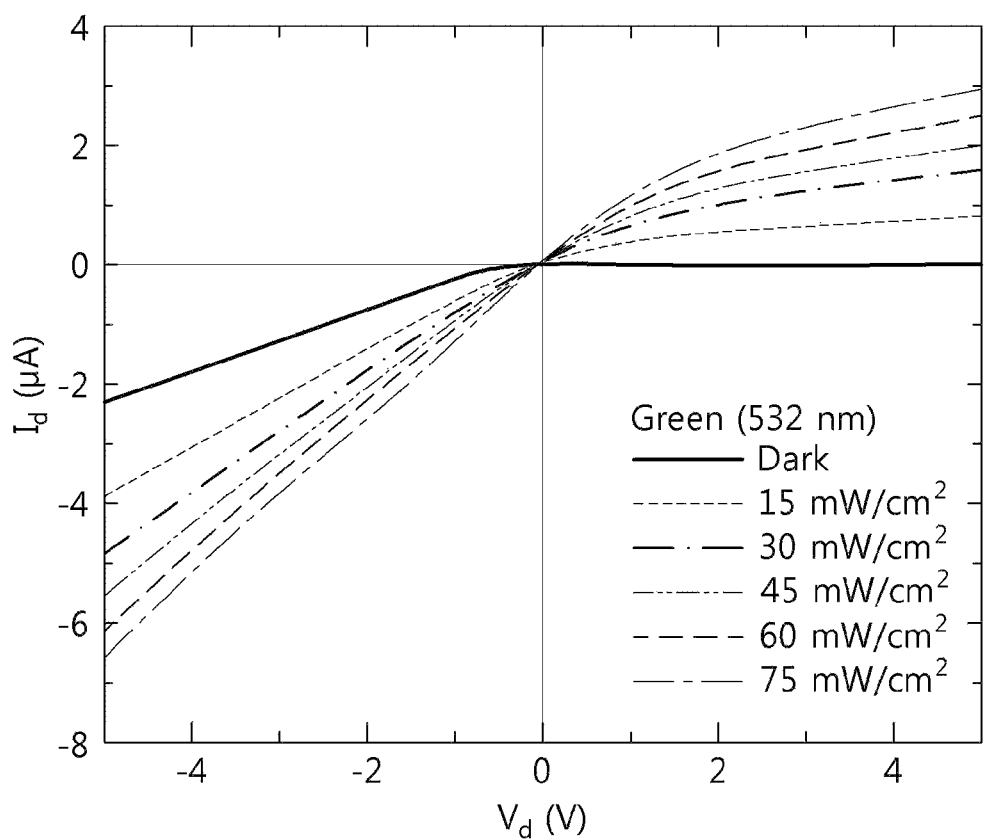
FIGS. 10A and 10B are graphs illustrating the characteristics of an optical amplification phototransistor according to an embodiment of the present invention as a photoconductor.
Figure 10B:
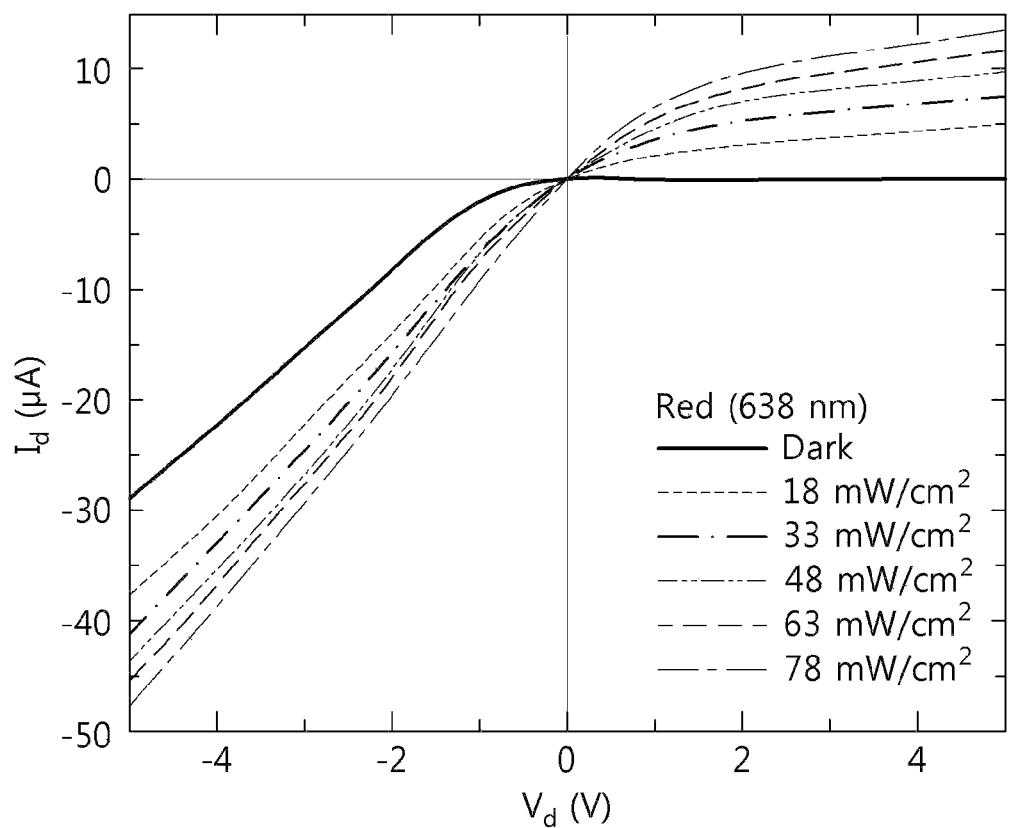

FIGS. 10A and 10B are graphs illustrating the characteristics of an optical amplification phototransistor according to an embodiment of the present invention as a photoconductor. FIG. 10A illustrates characteristic graphs when green light (532 nm) is radiated, and FIG. 10B illustrates characteristic graphs when red light (638 nm) is radiated.

Referring to FIGS. 10A and 10B, when light is radiated, the optical amplification phototransistor according to an embodiment of the present invention shows a tendency that resistance is lowered and conductivity is increased, compared to the case in which light is not radiated. In addition, a magnitude of a drain current increases as a wavelength of radiated light increases.

Figure 11:
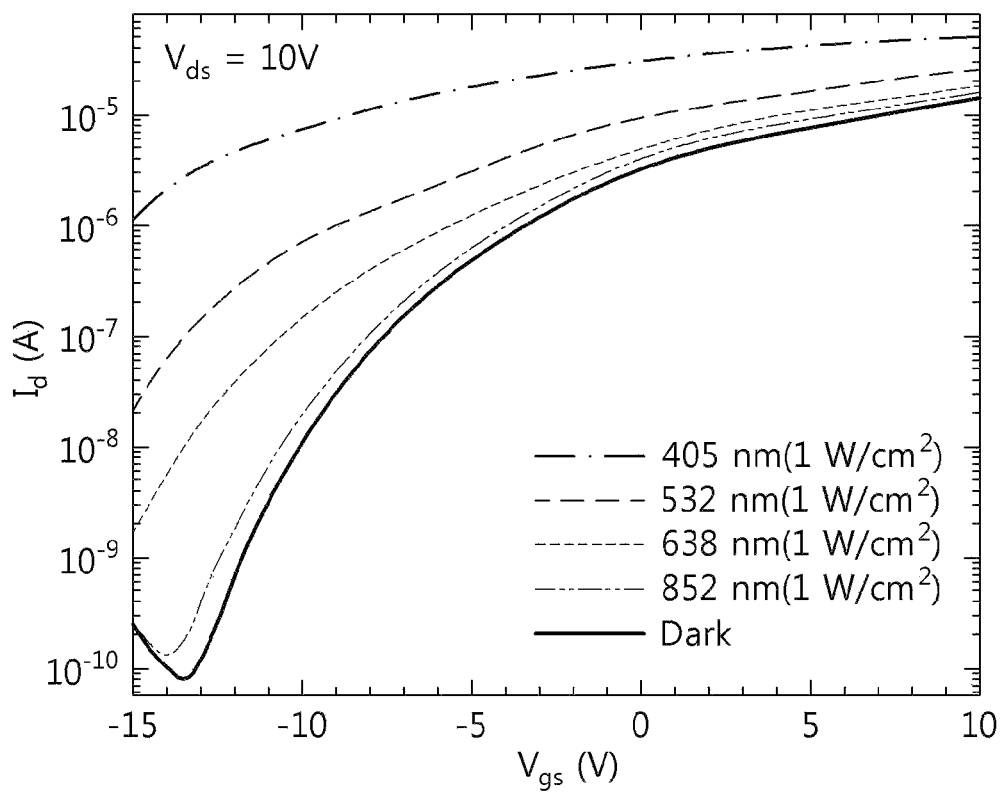
FIG. 11 illustrates a transfer curve graph of an optical amplification phototransistor according to an embodiment of the present invention.
Figure 12:
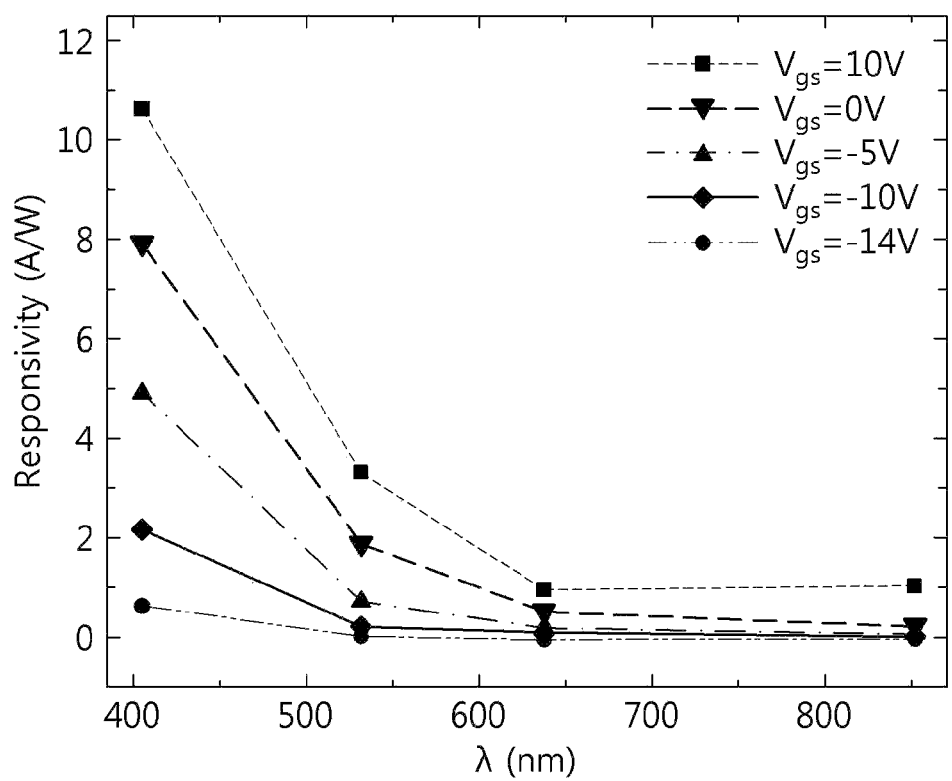
FIG. 12 is a graph illustrating photoreactive characteristics of an optical amplification phototransistor according to an embodiment of the present invention.

FIG. 11 illustrates a transfer curve graph of an optical amplification phototransistor according to an embodiment of the present invention, and FIG. 12 is a graph illustrating photoreactive characteristics of an optical amplification phototransistor according to an embodiment of the present invention.

Referring to FIGS. 11 and 12, it can be confirmed that, when light is applied, electron-hole pairs are generated in a channel region overlapping with a local gate electrode and a non-overlapping region of a channel region serving as a photoconductor, whereby conductivity of an entire channel is amplified and off-current and on-current of a phototransistor greatly increase.

As illustrated in FIGS. 11 and 12, the optical amplification phototransistor including the local gate electrode structure of the present invention exhibits amplified photoreactivity about 100 times to 1000 times greater than photoreactivity of 100 mAW-1 or less of a conventional technology having a common gate electrode structure instead of the local gate electrode (Woong Choi, et. al, Advanced Materials 24, 5382-5836 (2012)).

As illustrated in FIGS. 10 to 12, the optical amplification phototransistor of the present invention may amplify optical gain and photoreactivity by forming a local gate electrode and thus form a structure wherein a photoconductor and a phototransistor are coupled with each other.

Figure 13:
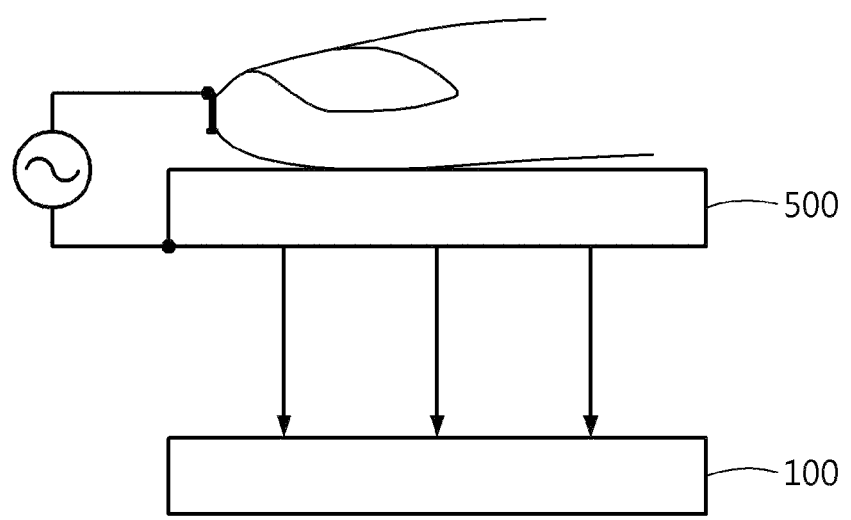
FIG. 13 illustrates an optical amplification-based photoreactive sensor including an optical amplification phototransistor according to an embodiment of the present invention.

FIG. 13 illustrates an optical amplification-based photoreactive sensor including an optical amplification phototransistor according to an embodiment of the present invention.

Referring to FIG. 13, the optical amplification-based photoreactive sensor may include an optical amplification phototransistor 100 and a contact light emitting device 500.

The optical amplification phototransistor 100 includes a channel region including a non-overlapping region that does not overlap with a local gate electrode between a source electrode and a drain electrode, and senses an optical image through the non-overlapping region for amplifying photoconductivity.

In accordance with an embodiment, the local gate electrode may be a local top gate structure or a local bottom gate structure. Description of the optical amplification phototransistor 100 having the local gate electrode structure is the same as that described with reference to FIGS. 1 to 4, and thus, a detailed description thereof is omitted.

The contact light emitting device 500 is formed on an optical amplification phototransistor, and generates an optical image corresponding to a contact surface upon contact with an object.

In accordance with an embodiment, the photoreactive sensor may include the array-based optical amplification phototransistor 100 for sensing at least one optical image and the contact light emitting device 500 for generating at least one optical image corresponding to a contacted surface upon contact of at least one object. Here, the contact light emitting device 500 may be implemented on a display that displays a character or a specific location.

Accordingly, the photoreactive sensor according to an embodiment of the present invention may generate an optical image corresponding to a contacted surface when contacts with a character or specific location displayed on a display, may sense the generated optical image, and may recognize information included in the character or specific location.

In accordance with another embodiment, the photoreactive sensor may be used in the security field to read fingerprints and perform authentication. Hereinafter, the contact light emitting device 500 for recognizing a fingerprint is described in detail with reference to FIG. 14.

Figure 14:
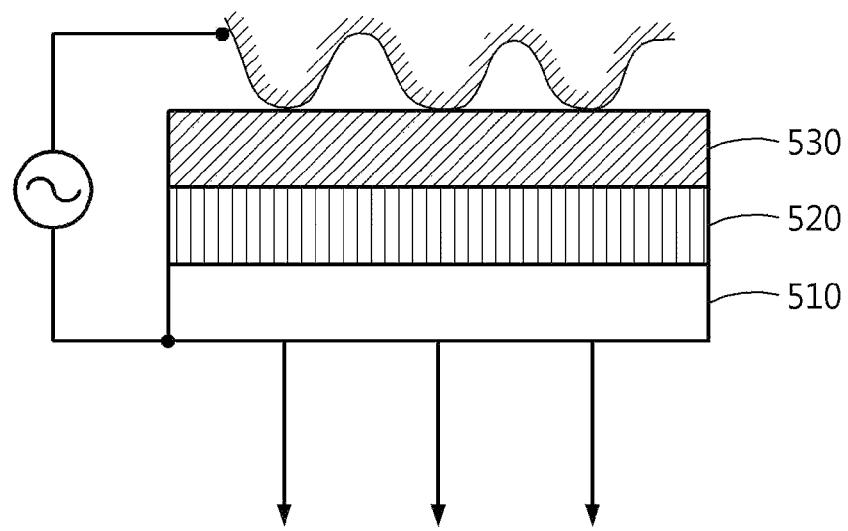
FIG. 14 illustrates a contact light emitting device of a photoreactive sensor according to an embodiment of the present invention.

FIG. 14 illustrates a contact light emitting device of a photoreactive sensor according to an embodiment of the present invention.

Referring to FIG. 14, the contact light emitting device 500 may include a transparent electrode layer 510, a light emitting layer 520, and a dielectric layer 530.

The transparent electrode layer 510 may be connected to one terminal of a power source (e.g., AC power source, etc.), may be formed of IZO, ITO, or graphene, as a transparent conductive material, and may be formed by direct deposition, in a thin film form, on an optical amplification phototransistor.

The light emitting layer 520 is formed on the transparent electrode layer 510, and may generate an optical image corresponding to a contacted surface upon contact with an object forming the ground.

More particularly, the light emitting layer 520 may generate an optical image corresponding to ridges of a contacted fingerprint upon contact of a fingerprint of a finger forming the ground.

For example, since an electric field between the transparent electrode layer 510, to which one terminal of an AC power source is connected, and a contacted finger is formed upon contact of a fingerprint of a finger, the light emitting layer 520 may generate an optical image corresponding to the contacted finger ridges due to the electric field.

In addition, the light emitting layer 520 may further include barium titanate for increasing luminescence brightness, and a black pigment for increasing contrast of an optical image.

The dielectric layer 530 may be formed on a light emitting layer, and may cause a generated optical image to be reflected off a surface of an optical amplification phototransistor. In addition, the dielectric layer 530 may be formed of a material having a high dielectric constant for increasing capacitance and may be formed in a single layer structure or a multilayer structure.

Accordingly, the contact light emitting device 500 may be formed in a structure wherein the transparent electrode layer 510, the light emitting layer 520, and the dielectric layer 530 are laminated.

In accordance with an embodiment, the contact light emitting device 500 may prevent penetration of foreign substances, may block external light to minimize noise in an optical image, and may further include a separate layer for generating a clearer optical image.

For example, the contact light emitting device 500 may be formed on the dielectric layer 530, may be formed of titanium oxynitride, as a photocatalyst, and a polymeric binder, and may further include a water-repellent layer (not shown) for minimizing an influence due to penetration of foreign substances, such as moisture and oil as main components of sweat, and noise in an optical image.

More particularly, the water-repellent layer may be formed of a material that prevents abrasion upon contact with an object and has hydrophobic and water repellent properties.

The contact light emitting device 500 may be formed between the light emitting layer 520 and the dielectric layer 530, and may further include a light-shielding layer (not shown) that minimizes noise in an optical image by blocking external light.

In addition, the contact light emitting device 500 may be formed on the light emitting layer 520, may be arranged at a predetermined interval to turn on/off an optical image, and may further include a plurality of patterned floating electrodes (not shown) to obtain a clearer optical image.

Accordingly, the contact light emitting device 500 may be formed in a structure wherein the transparent electrode layer 510, the light emitting layer 520, the floating electrodes (not shown), the light-shielding layer (not shown), the dielectric layer 530, and the water-repellent layer (not shown) are laminated. The laminated structure of the contact light emitting device 500 may be modified according to various embodiments.

In accordance with an embodiment, the contact light emitting device 500 may further include a plurality of patterned floating electrodes (not shown) that are arranged at a predetermined interval on the light emitting layer 520 and turns on/off an optical image.

In addition, the contact light emitting device 500 may be formed on the floating electrodes and may further include an insulating layer (not shown) for preventing penetration of foreign substances between the floating electrodes.

Figure 15:
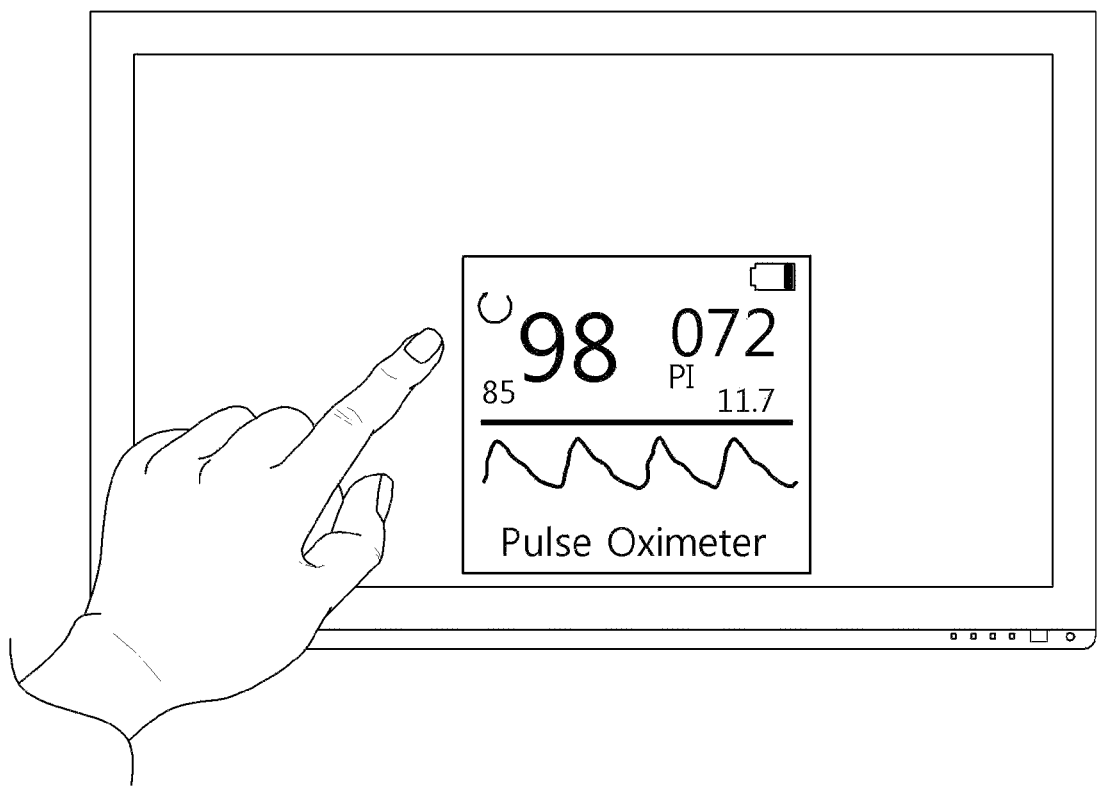
FIG. 15 illustrates a display panel in which an optical amplification-based photoreactive sensor according to an embodiment of the present invention is implemented.

FIG. 15 illustrates a display panel in which an optical amplification-based photoreactive sensor according to an embodiment of the present invention is implemented.

Referring to FIG. 15, the display panel including the photoreactive sensor according to an embodiment of the present invention may sense touch of a target subject such as a user's finger or an object (e.g., a touch pen), may sense a fingerprint of the target subject, and may sense photoreactive information including at least one of biometric information.

More particularly, the display panel including the photoreactive sensor according to an embodiment of the present invention may sense light reflected by a target object to amplify photoreactivity, may sense photoreactive information including at least one of fingerprint information, contact information, and biometric information on a target subject based on a degree of the amplified photoreactivity, and may display the sensed photoreactive information to a user.

In addition, when a target subject touches a character or a specific position displayed on a screen without use of a direct user input device such as a keyboard, the display panel including the photoreactive sensor according to an embodiment of the present invention may identify the touched position to obtain photoreactive information and may display the obtained photoreactive information.

The display panel including the photoreactive sensor according to an embodiment of the present invention may be applied to devices having a display module, such as a user terminal, a monitor and a television, capable of sensing contact.

Here, the user terminal may include mobile communication terminals such as a Personal Digital Assistant (PDA), a smartphone, an International Mobile Telecommunication 2000 (IMT-2000) terminal, a Wideband Code Division Multiple Access (WCDMA) terminal, a Universal Mobile Telecommunication Service (UMTS) terminal, and a tablet PC.

In addition, the aforementioned monitor and television may be terminals for checking individual health at home, or terminals for checking patient health for diagnosis in a hospital.

At home, the terminal may be used to limit exposure of privacy information of a user through fingerprint information and to check the health of a user in real time through biometric information.

In addition, in a hospital, the terminal may be used to confirm information related to health of a user (or a patient, etc.) while confirming identity information of the user, thereby being used to efficiently manage a patient.

Accordingly, a user (e.g., at least one of an individual, a doctor, an expert, and a nurse) using the display panel may obtain information for health management guidance through the display panel of the present invention and may be provided with appropriate exercise, food, lifestyle, and prescription based on the obtained information.

The biometric information may include information on the tissue and a function related to at least any one of melanin pigment concentration, hemoglobin concentration, pulse, and an oxygen saturation degree. In accordance with an embodiment, the biometric information may include information on the tissue and a function related to at least any one of the temperature and humidity of the skin tissue.

In accordance with an embodiment, when the display panel senses abnormal light reflected from a target subject, the display panel may display a touch icon (e.g., an icon recognizing contact information) re-requesting contact with a target subject.

In addition, the display panel may include a chargeable battery and may display a consumption state of the battery on a displayed screen.

The display panel according to an embodiment of the present invention includes a light source part and a photoreactive sensor. Here, the light source part may be operated in three manners.

For example, a light source part of a display panel according to a first embodiment of the present invention may generate light to output image information and obtain photoreactive information.

In addition, a light source part of a display panel according to a second embodiment of the present invention may generate light to obtain photoreactive information in a photoreactive region.

In addition, a light source part of a display panel according to a third embodiment of the present invention may generate light by forming a target subject as the ground of a power source. Hereinafter, the configuration of the display panel operated in three manners is described in detail with reference to the following drawings.

Figure 16:
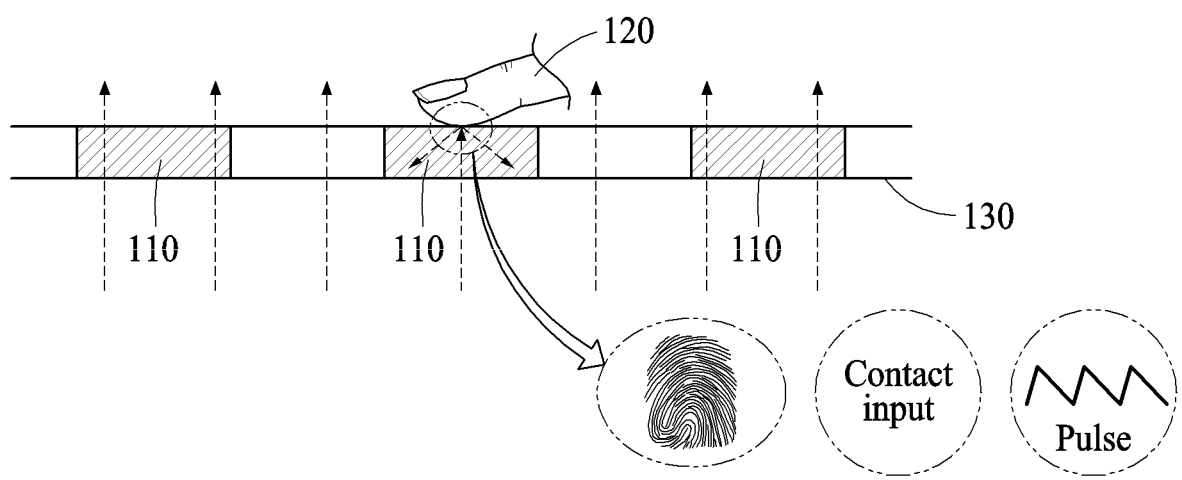
FIG. 16 illustrates the configuration of a display panel in which a photoreactive sensor according to an embodiment of the present invention is implemented.

FIG. 16 illustrates the configuration of a display panel in which a photoreactive sensor according to an embodiment of the present invention is implemented.

Referring to FIG. 16, the display panel includes a light source part (not shown) and photoreactive sensors 10.

<Display Panel According to First Embodiment of the Present Invention>

A light source part generates light.

More particularly, a light source part of a display panel of the present invention is formed on a lower part of a backplane based on a backlight method, and includes at least one illuminant of a halogen, a Quantum Dot (QD), a light emitting diode (LED), and an Organic Light Emitting Diode (OLED).

In addition, the light source part of the display panel of the present invention may generate light from a backplane and may irradiate a lower part of a substrate 30 to an upper part thereof with light. Light used herein may include an ultraviolet region to an infrared region.

The substrate 30 may be a flexible substrate or a glass substrate. The flexible substrate may be formed of at least any one of polyimide, polycarbonate, polyacrylate, polyether imide, polyethersulfone, polyethylene terephthalate, and polyethylene naphthalate.

Since the materials may be used at a high process temperate of 450° C. or more, property deterioration of the photoreactive sensors 10 upon fabrication of the photoreactive sensors 10 described below may be minimized.

In addition, the substrate 30 may include a plurality of scan lines and data lines that intersect each other to define each pixel region as illustrated in FIG. 9, and may include the photoreactive sensors 10 respectively corresponding to the pixels.

The photoreactive sensors 10 sense light generated from a light source part and reflected from a target subject 20 to amplify photoreactivity.

In addition, the photoreactive sensors 10 may provide photoreactive information including at least one of fingerprint information, contact information, and biometric information of a target subject based on a reactivity degree of amplified light.

In addition, the photoreactive sensors 10 may sense light reflected from the target subject 20 and may sense (e.g., contactless sensing) light reflected from the target object 20 located at a predetermined distance (or height).

Here, the target subject 20 may be at least any one of a user's finger, a stylus, and a touch pen, and may be any means capable of scattering light by touch of the substrate 30.

In accordance with an embodiment, the photoreactive sensors 10 may be arranged in an active matrix form, and may include an optical amplification phototransistor sensing light reflected from the target subject 20.

Figure 17:
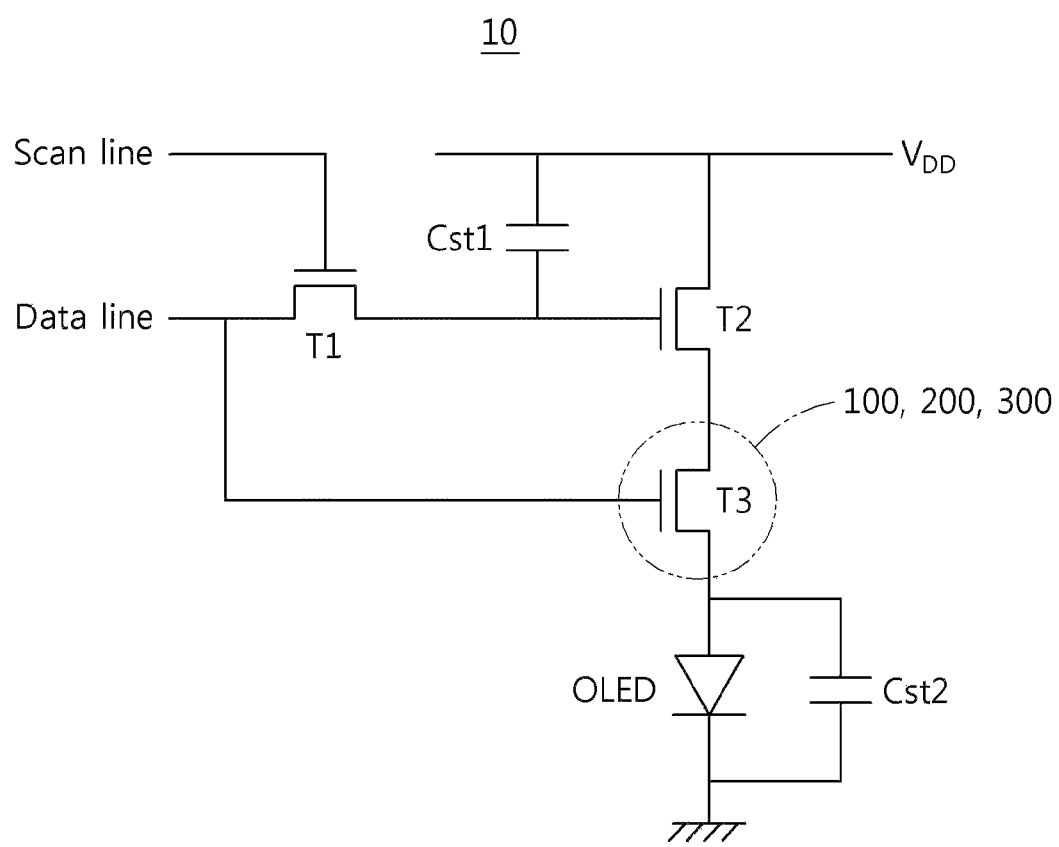
FIG. 17 illustrates a circuit diagram of the optical amplification-based photoreactive sensor of FIG. 16.

FIG. 17 illustrates a circuit diagram of the optical amplification-based photoreactive sensor of FIG. 16.

Referring to FIG. 17, the photoreactive sensors 10 includes a switching transistor T1, a first storage capacitor Cst1, a driving transistor T2, an optical amplification phototransistor T3 (100, 200, 300), and a second storage capacitor Cst2.

A gate and drain of the switching transistor T1 may be respectively connected to a scan line and a data line. A gate of the driving transistor T2 may be connected to a source of the switching transistor T1.

The first storage capacitor Cst1 may be connected in parallel to a gate and source of the driving transistor T2, and a source and drain of the optical amplification phototransistor T3 (100, 200, 300) may be respectively connected to the driving transistor T2, and the second storage capacitor Cst2 connected in parallel with a light source part.

The switching transistor T1 samples image information corresponding to each pixel, the first storage capacitor Cst1 stores image information, and the driving transistor T2 switches current supply to a light source part by a reference voltage of the stored image information.

Here, the switching transistor T1, which is an image sensor array, may sample image information to distinguish a position of each pixel (alternatively, to obtain active coordinates).

More particularly, the switching transistor T1 and the driving transistor T2 may define coordinates of each pixel, the first storage capacitor Cst1 may store image information, and the light source part may generate light based on a current supplied by the driving transistor T2.

In addition, the optical amplification phototransistor T3 (100, 200, 300) may sense light generated from a light source part and reflected from a target subject to amplify photoreactivity.

Accordingly, since the display panel according to the first embodiment of the present invention has a structure wherein the optical amplification phototransistor T3 (100, 200, 300) is inserted into the backplane structure including the switching transistor T1 and driving transistor T2 distinguishing active coordinates of each pixel, an interactive display may be provided at low cost.

In addition, since the display panel according to the first embodiment of the present invention has a structure wherein the light source for outputting image information and the light source for obtaining photoreactive information are integrally generated, a simplified structure may be provided.

The optical amplification phototransistor (T3, 100, 200, 300) transmits the switched current supply to the light source part, and senses light generated from the light source part and reflected from a target subject to amplify photoreactivity.

The second storage capacitor Cst2 stores photoreactive information including at least one of fingerprint information, contact information, and biometric information of a target subject based on a reactivity degree of the amplified light.

The photoreactive information may include fingerprint information, contact information and biometric information generated depending upon a reactivity degree of light reflected when the skin tissue (e.g., target subject) is irradiated with light in a visible light region and an infrared region.

For example, the fingerprint information may be information corresponding to ridges of a fingerprint present on a contact surface of a target subject.

The biometric information may include the tissue or a function related to at least any one of melanin pigment concentration, hemoglobin concentration, pulse, and an oxygen saturation degree.

More particularly, the biometric information may be information generated by an absorbance difference due to oxygenated hemoglobin and non-oxygenated hemoglobin contained in the skin tissue based on the degree of light reactivity.

In addition, the biometric information may include pulse information that reproduces a waveform produced by the blood pulsating based on the degree of light reactivity.

In accordance with an embodiment, the biometric information may include at least one of heat, pain, whitening, and trauma information of the skin tissue related to the temperature of the skin tissue, and at least one of moisturizing, skin drying, aging, and atrophy-related information of the skin tissue related to the humidity of the skin tissue.

The switching transistor T1 may be connected to a scan line and a data line and may perform a switching operation (e.g., sampling, etc.). For example, the switching transistor T1 is provided with predetermined luminance data through the data line, and may perform a switching operation because a low signal is sequentially applied through the scan line.

The first storage capacitor Cst1 may store image information (e.g., reference voltage) by voltage input to a gate of the driving transistor T2.

Here, the first storage capacitor Cst1 may still maintain voltage provided from a data line even when a high signal is applied to a scan line and the switching transistor T1 is turned off.

The driving transistor T2 may determine a supply current provided to a light source part by voltage and threshold voltage input to a gate.

Here, channels of the switching transistor T1 and the driving transistor T2 may be formed of amorphous silicon or polycrystalline silicon, and the optical amplification phototransistor T3 (100, 200, 300) may include a channel region including a local gate electrode structure, a non-overlapping region, and transition metal chalcogen compound (transition metal dichalcogenide) so as to amplify optical gain or photoreactivity.

In addition, as described above, the optical amplification phototransistor T3 (100, 200, 300) may include a channel region including a non-overlapping region that is disposed between a source electrode and a drain electrode and does not overlap with a local gate electrode, and may sense light reflected from the non-overlapping region that amplifies photoconductivity.

Figure 18A:
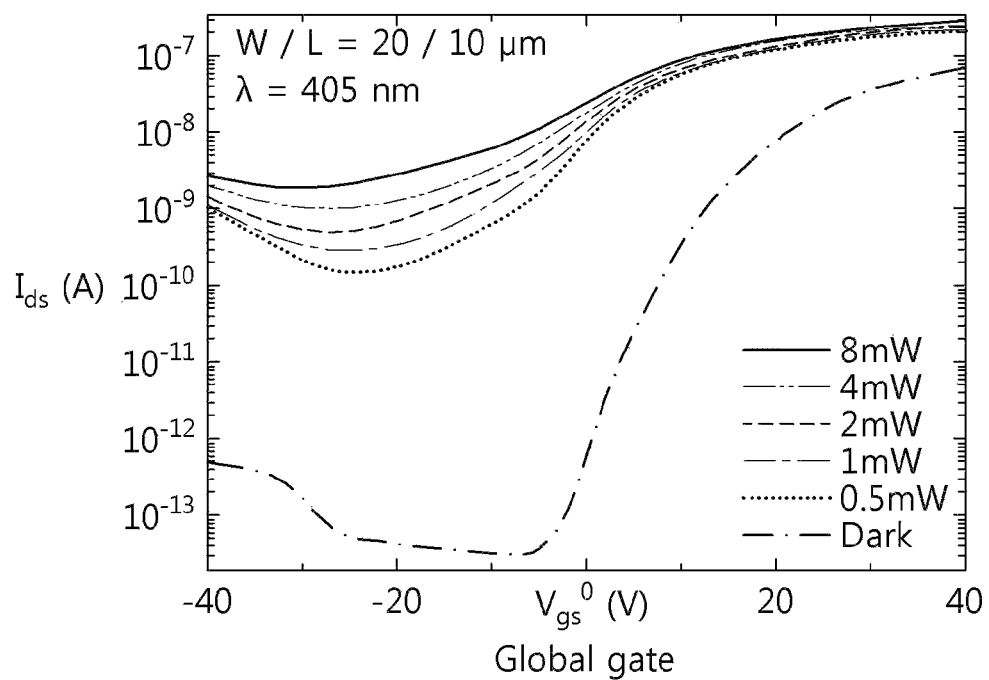
FIG. 18A is a graph illustrating optical characteristics of a phototransistor in which a non-overlapping region is absent.
Figure 18B:
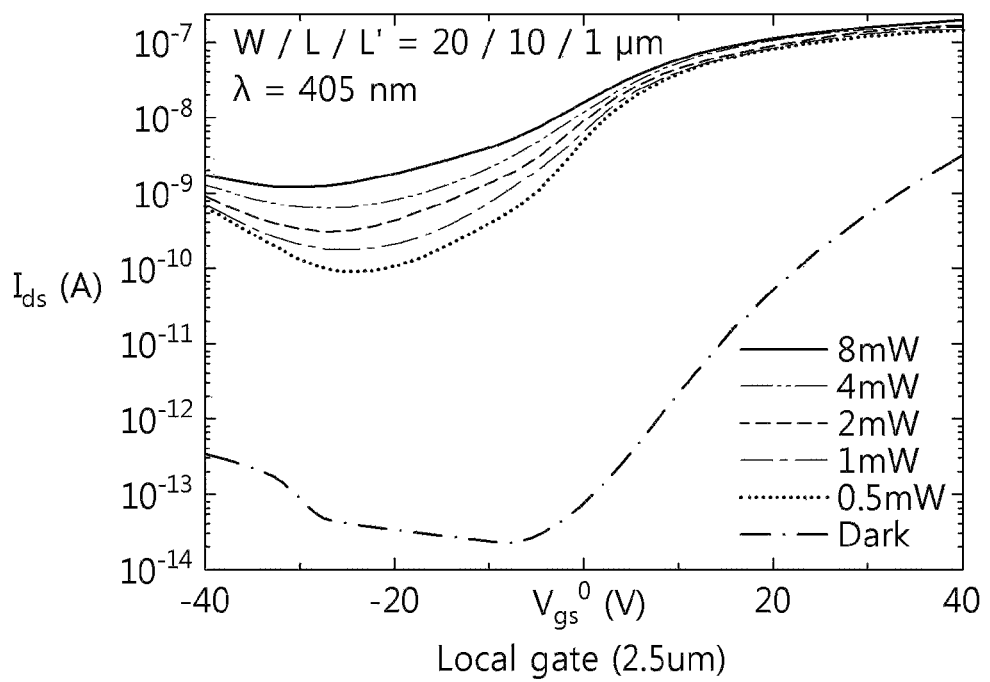
FIGS. 18B to 18D are graphs illustrating optical characteristics of optical amplification phototransistors having a local gate structure of the present invention.
Figure 18C:
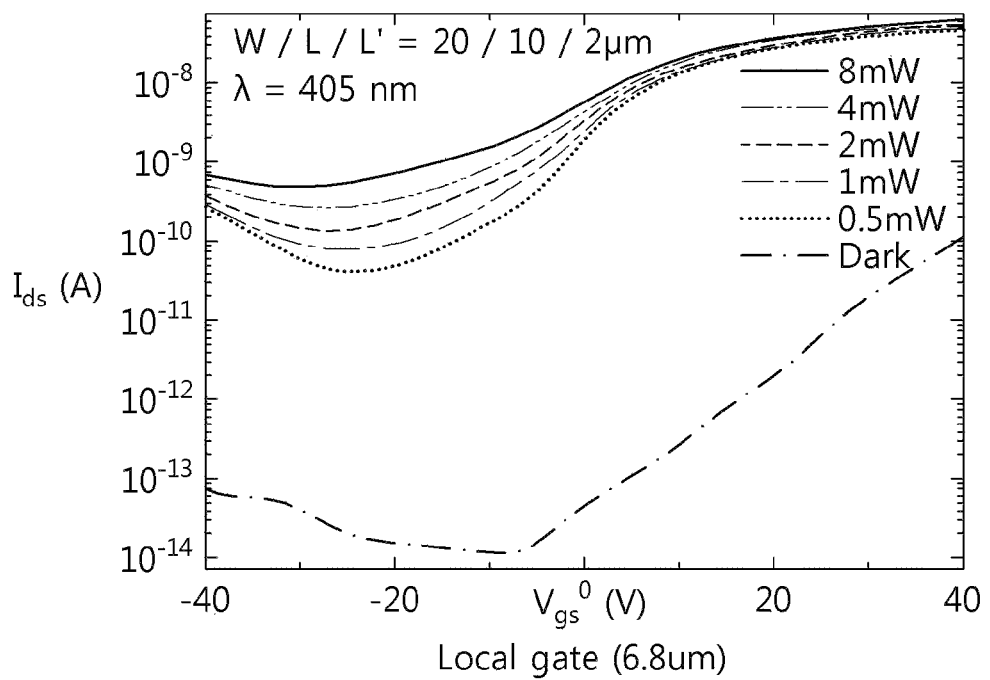
Figure 18D:
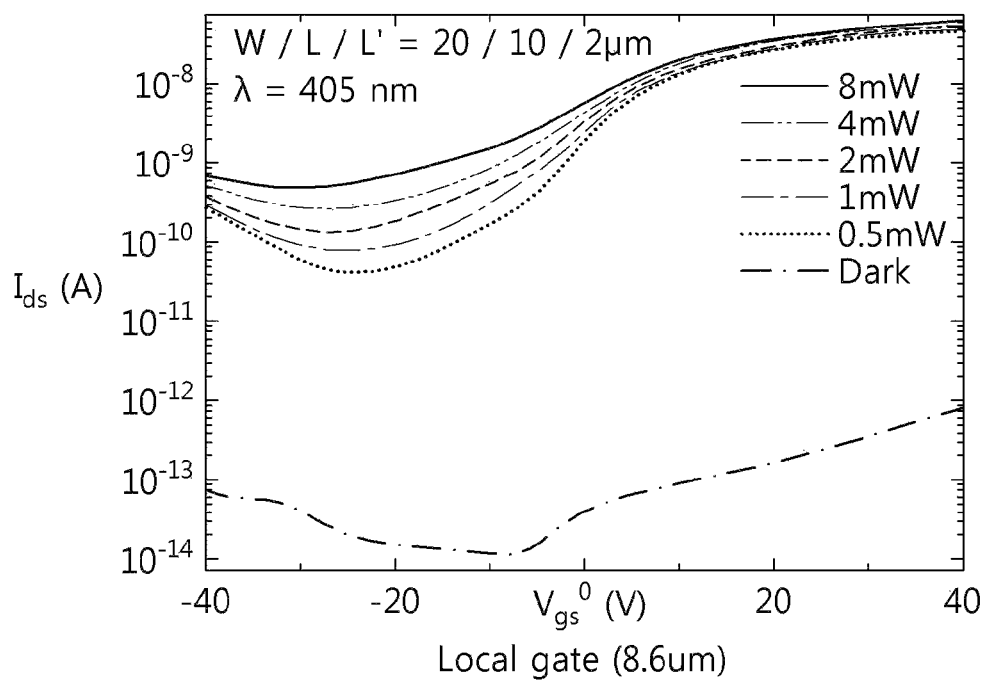

FIG. 18A is a graph illustrating optical characteristics of a phototransistor in which a non-overlapping region is absent, and FIGS. 18B to 18D are graphs illustrating optical characteristics of optical amplification phototransistors having a local gate structure of the present invention.

Referring to FIGS. 18A to 18D, it can be confirmed that an optical amplification phototransistor having the local gate electrode structure of the present invention has a photoreactivity at least about 100 times or at most about 120,000 times higher than that of a phototransistor including a gate in which a non-overlapping region is absent (e.g., a phototransistor with a global gate electrode structure).

As illustrated in FIG. 18A, it can be confirmed that, when voltage applied between a gate and a source in a phototransistor having a global gate electrode structure is about 20 V or more, photoreactivity increases by at least 10 times, compared to the case in which light is not applied (dark).

On the other hand, it can be confirmed that, when a voltage (Vgs) applied between a gate and a source in the optical amplification phototransistor having the local gate electrode structure of the present invention is about 20 V or more, photoreactivity increases by at least 100 times, compared to the case in which light is not applied (dark) as illustrated in FIGS. 18B to 18D.

In addition, the optical amplification phototransistor having the local gate electrode structure of the present invention may have increased photoreactivity with increasing width of the local gate, as illustrated in FIGS. 18B to 18D.

The photoreactivity increases because electron-hole pairs are generated in a channel region overlapping with a local gate electrode and a non-overlapping region of a channel region operating as a photoconductor and thus conductivity of an entire channel is amplified and off-current and on-current of a phototransistor greatly increase.

<Display Panel According to Second Embodiment of the Present Invention>

The display panel including the photoreactive sensor according to the second embodiment of the present invention may increase a sensing recognition rate for sensing light reflected from a target subject by separately generating a light source for obtaining photoreactive information in a photoreactive region.

For example, a user may touch a portion displaying a photoreactive region on a screen of a display panel to provide an input value for photoreactive information, and the display panel may sense light reflected from the portion (target subject) touched by a user.

Referring to FIG. 17 again, the display panel includes a light source part (not shown) and the photoreactive sensors 10.

The light source part generates light to obtain photoreactive information including at least one of fingerprint information, contact information, and biometric information of a target subject. Here, the light source part may generate light to be radiated to a photoreactive region.

The photoreactive sensors 10 includes a switching transistor T1, a first storage capacitor Cst1, a driving transistor T2, an optical amplification phototransistor T3 (100, 200, 300), and a second storage capacitor Cst2.

A gate and drain of the switching transistor T1 may be respectively connected to a scan line and a data line. A gate of the driving transistor T2 may be connected to a source of the switching transistor T1.

The first storage capacitor Cst1 may be connected in parallel to a gate and source of the driving transistor T2, and a source and drain of the optical amplification phototransistor T3 (100, 200, 300) may be respectively connected to the driving transistor T2, and the second storage capacitor Cst2 connected in parallel with an illuminant.

The switching transistor T1 samples image information corresponding to each pixel, the first storage capacitor Cst1 stores image information, and the driving transistor T2 switches current supply to an illuminant by a reference voltage of the stored image information Here, the switching transistor T1, which is an image sensor array, may sample image information to distinguish a position of each pixel (alternatively, to obtain active coordinates).

More particularly, the switching transistor T1 and the driving transistor T2 may define coordinates of each pixel, the first storage capacitor Cst1 may store image information, and the illuminant may generate light for inputting image information based on a current supplied by the driving transistor T2.

In addition, the illuminant may be formed on a lower part of a backplane based on a backlight method, and may include at least one of a halogen, a Quantum Dot (QD), a light emitting diode (LED), and an Organic Light Emitting Diode (OLED).

In addition, the optical amplification phototransistor T3 (100, 200, 300) may sense light generated from a light source part and reflected from a target subject to amplify photoreactivity.

More particularly, the optical amplification phototransistor T3 (100, 200, 300) may sense light reflected from a target object located in a photoreactive region to amplify the photoreactivity.

Accordingly, the display panel according to the second embodiment of the present invention may increase a sensing recognition rate for sensing light reflected from a target subject by separately generating a light source for obtaining photoreactive information in a photoreactive region.

Figure 19:
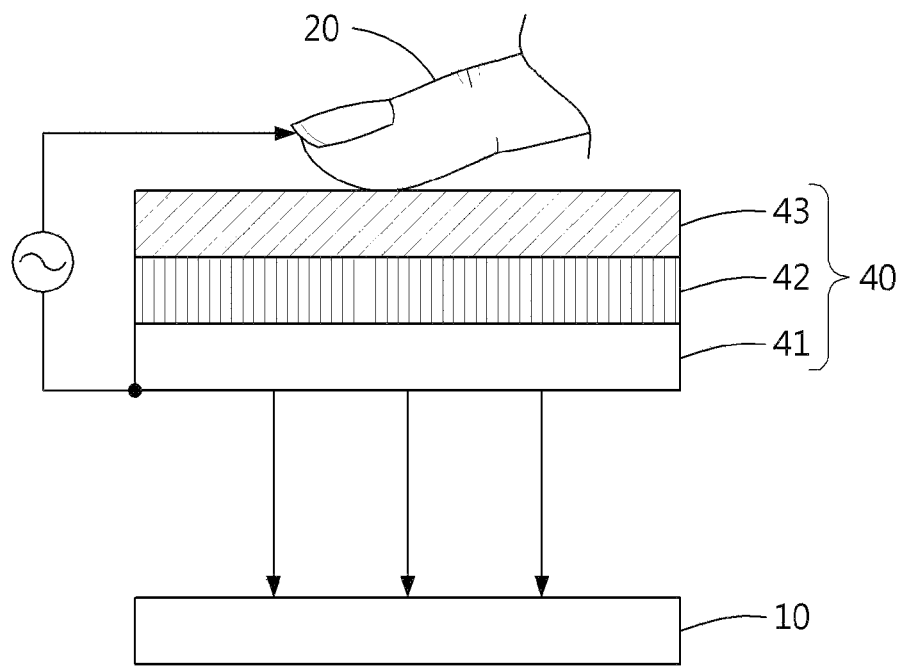
FIG. 19 illustrates the configuration of a display panel in which a photoreactive sensor according to another embodiment of the present invention is implemented.

FIG. 19 illustrates the configuration of a display panel in which a photoreactive sensor according to another embodiment of the present invention is implemented.

<Display Panel According to Third Embodiment of the Present Invention>

Referring to FIG. 19, the display panel including the photoreactive sensor according to the third embodiment of the present invention may generate light corresponding a contacted surface upon contact with a target subject based on a light emitting method of generating light by forming a target subject as the ground of a power source.

A display panel including a photoreactive sensor according to another embodiment of the present invention includes a light source part 40 and a photoreactive sensor 10.

Description of the photoreactive sensor 10 is the same as that described above, and thus, a detail description thereof is omitted.

The light source part 40 may include a transparent electrode layer 41, a light emitting layer 42, and a dielectric layer 43.

The transparent electrode layer 41 may be connected to one terminal of a power source (e.g., AC power source, etc.), may be formed of IZO, ITO, or graphene, as a transparent conductive material, and may be formed by direct deposition, in a thin film form, on a photodevice.

The light emitting layer 42 is formed on the transparent electrode layer 41, and may generate light corresponding to a contacted surface upon contact with a target subject forming the ground.

More particularly, the light emitting layer 42 may generate light corresponding to ridges of a contacted fingerprint upon contact of a fingerprint of a finger forming the ground.

For example, since an electric field between the transparent electrode layer 41, to which one terminal of an AC power source is connected, and a contacting finger is formed upon contact of a fingerprint of a finger, the light emitting layer 42 may generate light corresponding to the contacted finger ridges due to the electric field.

In addition, the light emitting layer 43 may further include barium titanate for increasing luminescence brightness, and a black pigment for increasing contrast of light.

The dielectric layer 43 may be formed on a light emitting layer, and may cause generated light to be reflected from a surface of the display panel. In addition, the dielectric layer 43 may be formed of a material having a high dielectric constant for increasing capacitance and may be formed in a single layer structure or a multilayer structure.

Accordingly, the light source part 40 may be formed in a structure wherein the transparent electrode layer 41, the light emitting layer 42, and the dielectric layer 43 are laminated.

In accordance with an embodiment, the light source part 40 may prevent penetration of foreign substances, may block external light to minimize noise in light, and may further include a separate layer for generating highly-sensitive and clear light.

For example, the light source part 40 may be formed on the dielectric layer 43, may be formed of titanium oxynitride, as a photocatalyst, and a polymeric binder, and may further include a water-repellent layer (not shown) for minimizing an influence due to penetration of foreign substances, such as moisture and oil as main components of sweat, and noise in light.

More particularly, the water-repellent layer may be formed of a material that prevents abrasion upon contact with a target subject and has hydrophobic and water repellent properties.

The light source part 40 may be formed between the light emitting layer 42 and the dielectric layer 43, and may further include a light-shielding layer (not shown) that minimizes noise in light by blocking external light.

In addition, the light source part 40 may be formed on the light emitting layer 42, may be arranged at a predetermined interval to turn on/off light, and may further include a plurality of patterned floating electrodes (not shown) to obtain a clearer optical image.

Accordingly, the light source part 40 may be formed in a structure wherein the transparent electrode layer 41, the light emitting layer 42, the floating electrodes (not shown), the light-shielding layer (not shown), the dielectric layer 43, and the water-repellent layer (not shown) are laminated. The light source part 40 may be modified according to various embodiments.

In accordance with an embodiment, the light source part 40 may further include plurality of patterned floating electrodes (not shown) that are arranged at a predetermined interval on the light emitting layer 42 and turns on/off an optical image.

In addition, the light source part 40 may be formed on the floating electrodes and may further include an insulating layer (not shown) for preventing penetration of foreign substances between to the floating electrodes.

Accordingly, the display panel according to the third embodiment of the present invention generates light by forming a target subject as the ground of a power source, thereby reducing power consumption.

Figure 20:
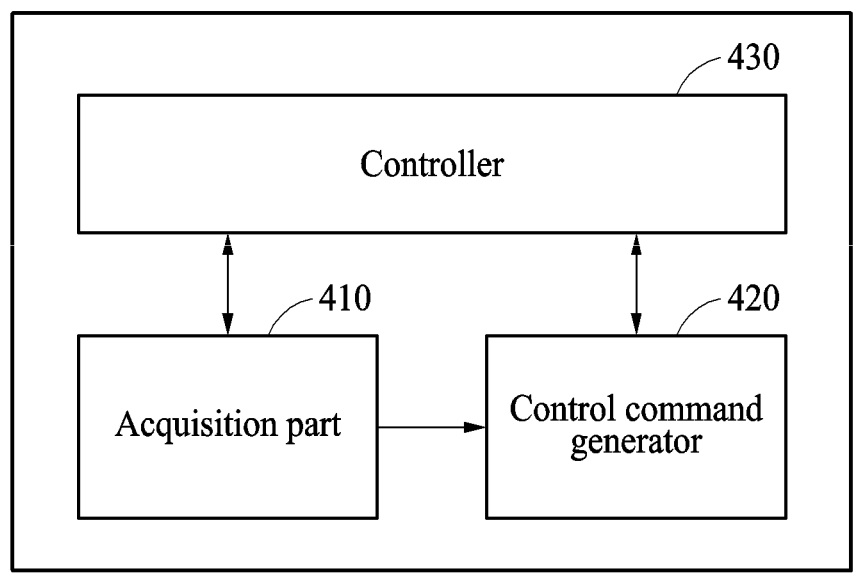
FIG. 20 illustrates a block diagram of a vehicle control system in which a photoreactive sensor according to an embodiment of the present invention is implemented.

FIG. 20 illustrates a block diagram of a vehicle control system in which a photoreactive sensor according to an embodiment of the present invention is implemented.

Referring to FIG. 20, a vehicle control system 400 includes an acquisition part 410, a control command generator 420, and a controller 430.

The acquisition part 410 includes a photoreactive sensor including an optical amplification phototransistor formed on at least one of a door, a trunk, a handle, a display, a start button, a smart key, and a predetermined position of a vehicle.

In accordance with an embodiment, the acquisition part 410 may include a photoreactive sensor including a plurality of optical amplification phototransistors.

For example, the optical amplification phototransistors may sense and amplify photoreactive information (fingerprint information, contact information, and biometric information) on a target object (e.g., a user's finger, a stylus, and a touch pen).

The photoreactive sensor may be formed on a door, a trunk, a handle, a display, a start button, a smart key, and a predetermined position of a vehicle.

The predetermined position may be a windshield or side glass formed on the exterior or interior of a vehicle and may be a shifter (e.g., gear selector), a seat, a dashboard, and an attached device (e.g., a temperature control device, a player, and a hot wire device) inside a vehicle. However, the present invention is not limited thereto and various positions are possible.

Hereinafter, photoreactive sensors formed at various positions of a vehicle with reference to FIGS. 21A to 21E are described.

Figure 21A:
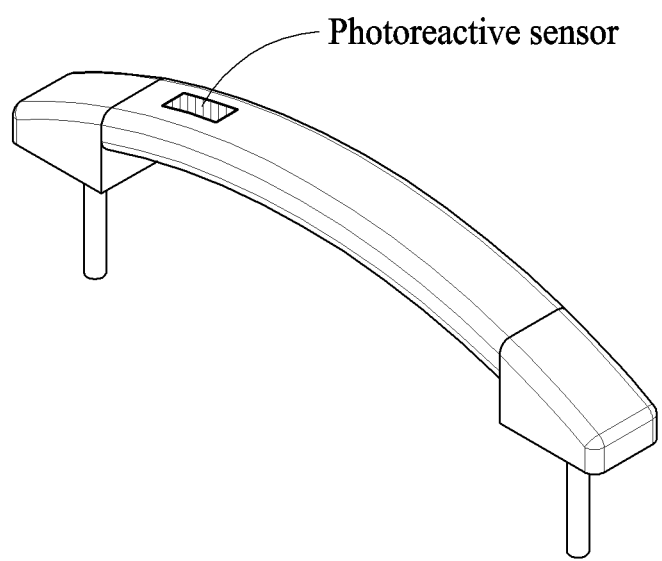
FIG. 21A illustrates an embodiment of a photoreactive sensor formed on a door or trunk of a vehicle.
Figure 21B:
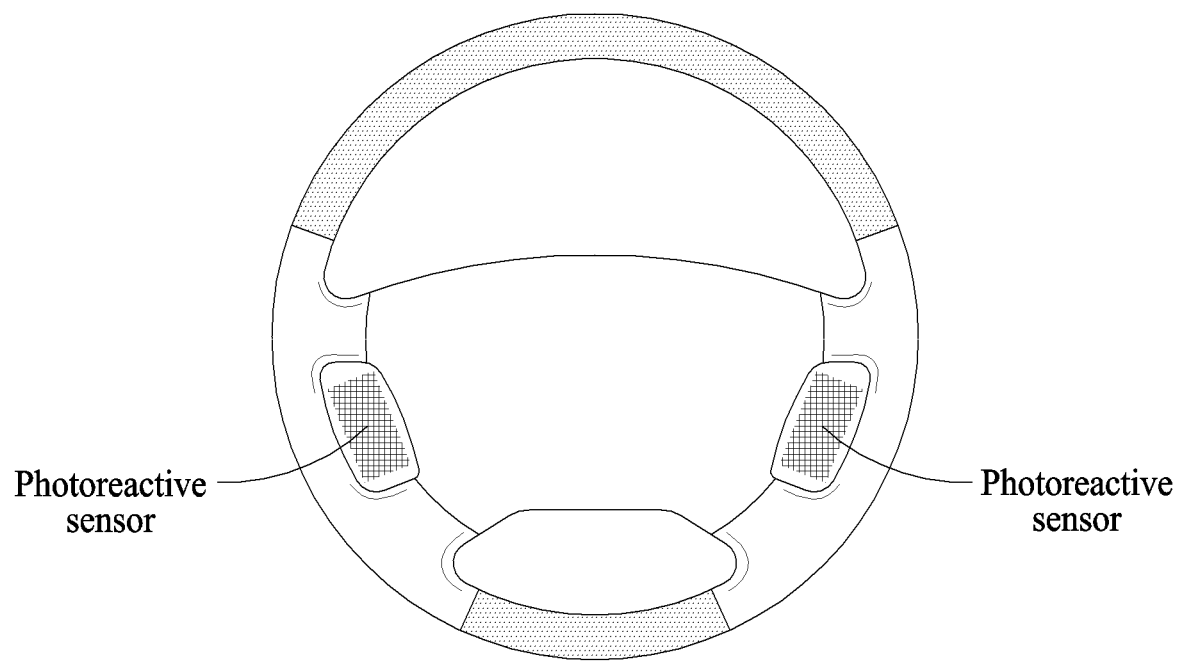
FIG. 21B illustrates an embodiment of a photoreactive sensor formed on a handle of a vehicle.
Figure 21C:
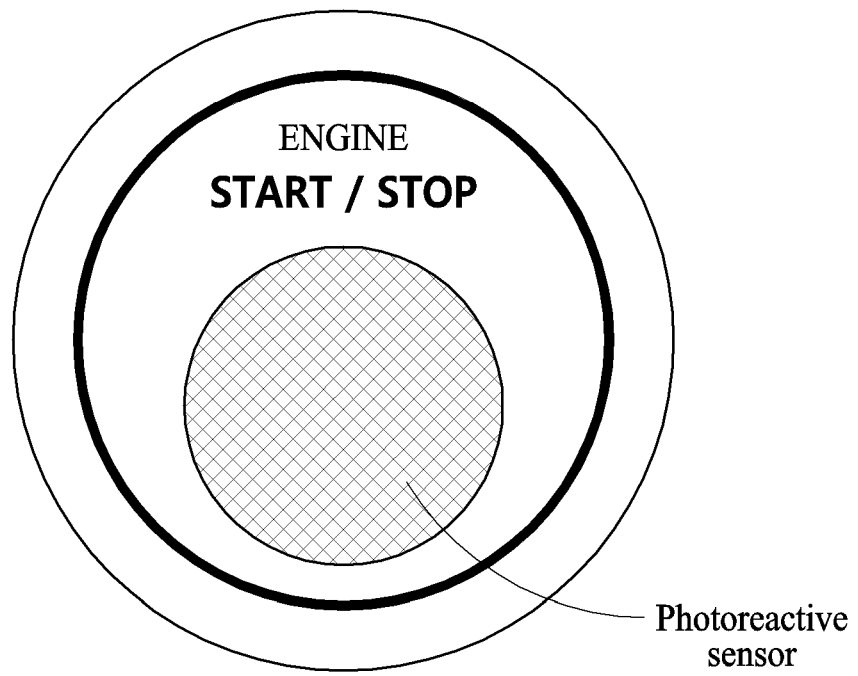
FIG. 21C illustrates an embodiment of a photoreactive sensor formed on a start button of a vehicle.

FIG. 21A illustrates an embodiment of a photoreactive sensor formed on a door or trunk of a vehicle, FIG. 21B illustrates an embodiment of a photoreactive sensor formed on a handle of a vehicle, and FIG. 21C illustrates an embodiment of a photoreactive sensor formed on a start button of a vehicle.

Figure 21D:
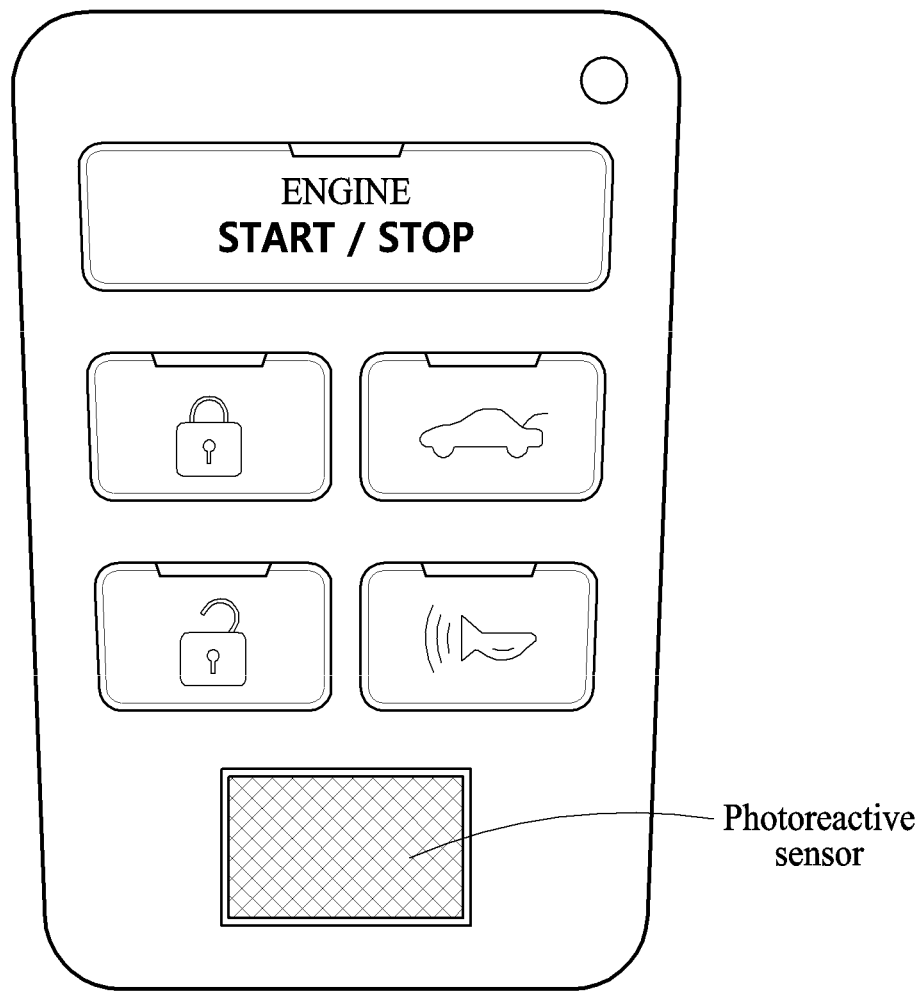
FIG. 21D illustrates an embodiment of a photoreactive sensor formed on a smart key for performing wireless communication with a vehicle.
Figure 21E:
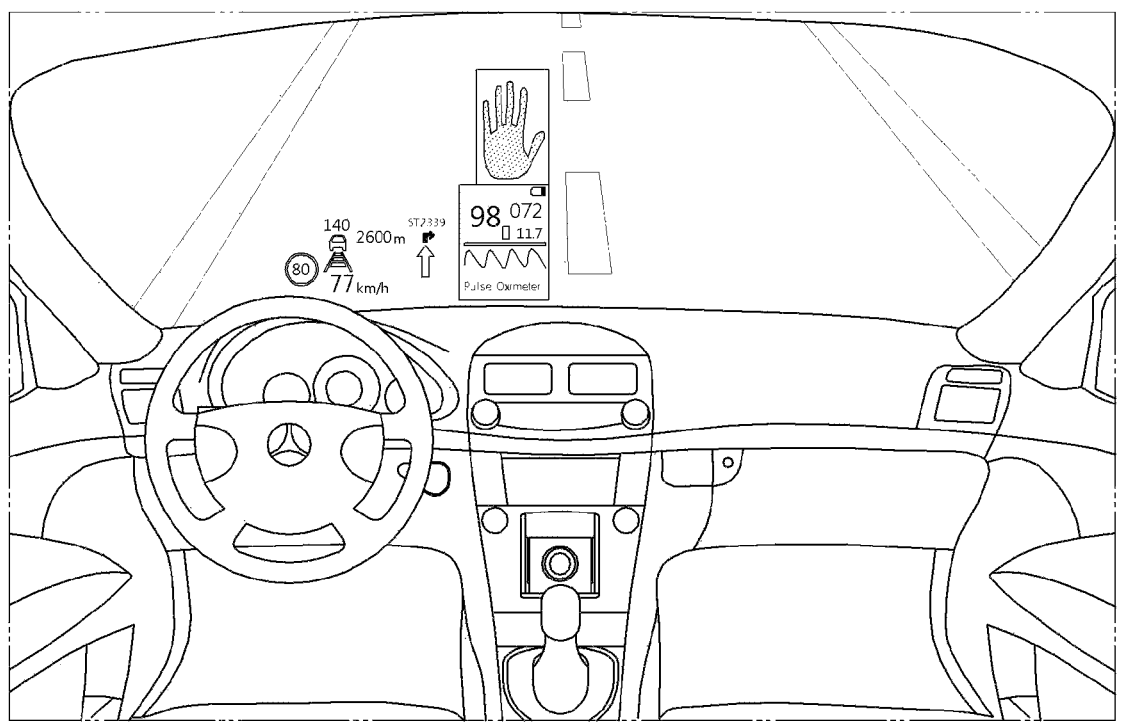
FIG. 21E illustrates an embodiment of a photoreactive sensor formed on a display for a windshield of a vehicle.

FIG. 21D illustrates an embodiment of a photoreactive sensor formed on a smart key for performing wireless communication with a vehicle, and FIG. 21E illustrates an embodiment of a photoreactive sensor formed on a display for a windshield of a vehicle.

Referring to FIG. 21A, the photoreactive sensor may be formed on a door or trunk of a vehicle. More particularly, the photoreactive sensor may be formed on a handle of a door or trunk of a vehicle.

Referring to FIG. 21B, the photoreactive sensor may be formed on a handle of a vehicle. More particularly, the photoreactive sensor may be formed on the front of a handle and a portion of a handle Referring to FIG. 21C, the photoreactive sensor may be formed on a start button of a vehicle. More particularly, the photoreactive sensor may be formed on a surface of the start button.

Referring to FIG. 21D, the photoreactive sensor may be formed on a smart key for performing wireless communication with a vehicle. More particularly, the photoreactive sensor may be formed on one side surface of the smart key.

Referring to FIG. 21E, the photoreactive sensor may be formed on a display for a windshield of a vehicle. More particularly, the photoreactive sensor may be formed on a display for a windshield of a vehicle including a transparent material.

As illustrated in FIGS. 21A to 21E, the photoreactive sensor may be formed at various positions and predetermined positions of a vehicle, but the present invention is not limited thereto.

Referring to FIG. 20 again, the acquisition part 410 senses and amplifies light reflected from a target object through the photoreactive sensor, and acquires photoreactive information including at least one of fingerprint information, contact information, and biometric information of a target object based on a reactivity degree of amplified light.

Here, the acquisition part 410 may include a light source part generating light to sense and amplify light reflected from a target object. The acquisition part 410 including the light source part and the photoreactive sensor has the same structure as that described with reference to FIGS. 16 and 19 above and may be implemented as a vehicle control system instead of a display panel. Description thereof has been provided above, and thus, a detailed description thereof is omitted.

Figure 22:
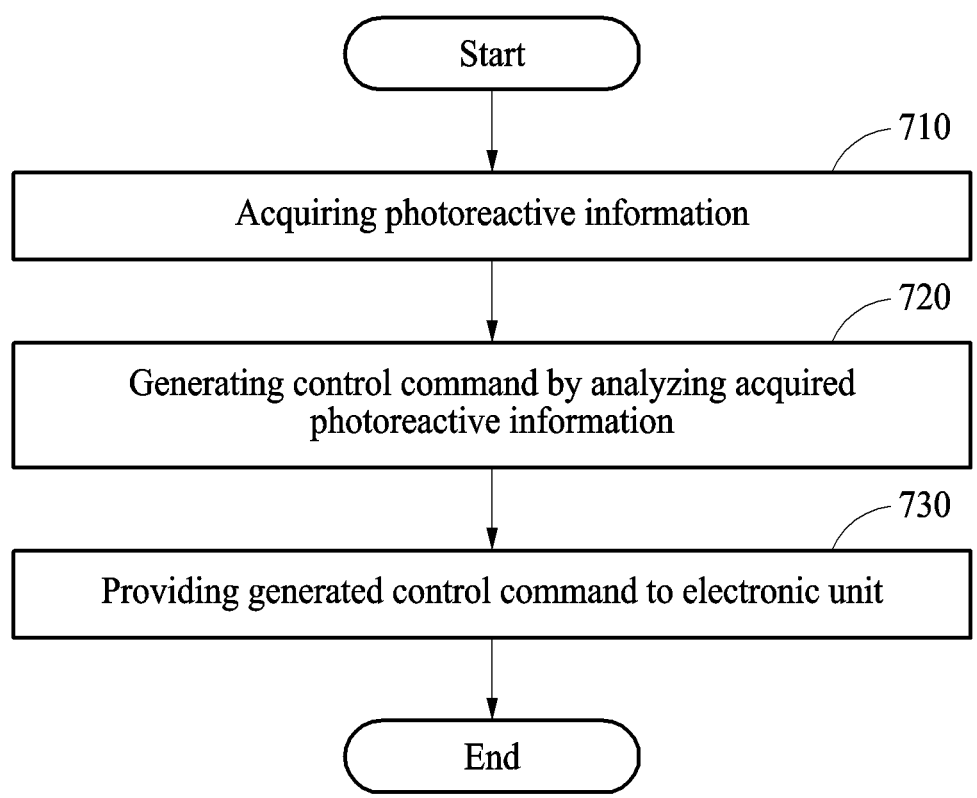
FIG. 22 is a flowchart illustrating an operation method of a vehicle control system to which an optical amplification-based photoreactive sensor according to an embodiment of the present invention is applied.

FIG. 22 is a flowchart illustrating an operation method of a vehicle control system to which an optical amplification-based photoreactive sensor according to an embodiment of the present invention is applied.

Referring to FIG. 22, in step 710, a vehicle control system senses and amplifies light reflected from a target object through an optical amplification phototransistor formed on at least one of a door, a trunk, a handle, a display, a start button, a smart key, and a predetermined position of a vehicle, and acquires photoreactive information including at least one of fingerprint information, contact information, and biometric information of a target object based on a reactivity degree of amplified light.

The predetermined position may be a windshield or side glass formed on the exterior or interior of a vehicle and may be (e.g., gear selector), a seat, a dashboard, and an attached device (e.g., a temperature control device, a player, and a hot wire device) inside a vehicle. However, the present invention is not limited thereto and various positions are possible.

In accordance with an embodiment, in step 710, the vehicle control system may generate light to sense and amplify light reflected from a target object through the light source part, and may sense and amplify light reflected from a target object through the photoreactive sensor including the optical amplification phototransistor.

The light source part may be formed on a lower part of a backplane based on a backlight method, and may include at least one illuminant of a halogen, a Quantum Dot (QD), a light emitting diode (LED), and an Organic Light Emitting Diode (OLED).

In addition, the light source part may generate light from a backplane and may irradiate a lower part of a substrate to an upper part thereof with light. Light used herein may include ultraviolet to infrared.

In accordance with an embodiment, the light source part may generate a light source for obtaining photoreactive information or a light source for outputting image information.

Here, the light source for outputting image information may be formed by the light source part or the illuminant.

In accordance with another embodiment, the light source part may form a target object as the ground of a power source to generate light based on a light emitting method. More particularly, the light source part may generate light corresponding to a contacted surface upon contact with a target object.

In step 720, the vehicle control system analyses the acquired photoreactive information and generates a control command.

In accordance with an embodiment, the vehicle control system may determine whether a driver matches a registered driver by analyzing the acquired photoreactive information and may generate a control command corresponding to a determination result, in step 720.

For example, the vehicle control system may set and store a fingerprint pattern of a driver, may determine whether a driver matches a registered driver by analyzing the stored fingerprint pattern and fingerprint information included in photoreactive information, and may generate a control command corresponding to a determination result.

In addition, in step 720, the vehicle control system may generate a control command controlling at least one of opening/closing of a door or a trunk and on/off of starting corresponding to a determination result of matching with a registered driver.

In accordance with an embodiment, in step 720, the vehicle control system may determine whether a driver matches a registered driver by analyzing acquired photoreactive information and may generate the control command corresponding to a determination result.

For example, the vehicle control system may store a biosignal range reference corresponding to safe driving, may determine whether driving is possible by analyzing biometric information included in the stored biosignal range reference and photoreactive information, and may generate a control command corresponding to the determination result.

In addition, in step 720, the vehicle control system may generate a control command that controls at least one of opening/closing of a door or a trunk, on/off of start, and a speed (e.g., deceleration) corresponding to the determination result as to whether driving is possible.

In accordance with an embodiment, in step 720, the vehicle control system may generate a control command to display biometric information on a display.

In step 730, the vehicle control system provides the generated control command to an electronic unit performing an operation to correspond to the generated control command.

Here, an electronic unit or an Electronic Control Unit (ECU) may process information transmitted by a plurality of sensors depending on operating states of vehicle subsystems.

The sensor may include at least one of a throttle valve switch having characteristic ignition and idle values, a distributor or ignition coil having a characteristic rotational speed value, an ignition/start switch having a characteristic start-up value, an engine temperature sensor, an atmospheric pressure sensor, and an air ratio sensor.

In accordance with an embodiment, in step 730, the vehicle control system may transmit a control command for controlling an operation of the sensor to an electronic unit.

Embodiments of the present invention can include a computer readable medium including program commands for executing operations implemented through various computers. The computer readable medium can store program commands, data files, data structures or combinations thereof. The program commands recorded in the medium may be specially designed and configured for the present invention or be known to those skilled in the field of computer software. Examples of a computer readable recording medium include magnetic media such as hard disks, floppy disks and magnetic tapes, optical media such as CD-ROMs and DVDs, magneto-optical media such as floptical disks, or hardware devices such as ROMs, RAMs and flash memories, which are specially configured to store and execute program commands. Examples of the program commands include a machine language code created by a compiler and a high-level language code executable by a computer using an interpreter and the like. The hardware devices may be configured to operate as one or more software modules to perform operations of embodiments, and vice versa.

Although the present invention has been described through limited embodiments and figures, the present invention is not intended to be limited to the embodiments. Those skilled in the art will appreciate that various modifications, additions and substitutions are possible, without departing from the scope and spirit of the invention. For example, although the techniques described are performed in a different order from the described methods, and/or the components, such as the described systems, structures, devices, and circuits, are combined in different forms from the described methods or are replaced or substituted by other components or equivalents, proper results may be accomplished.

It should be understood, therefore, that the invention is to cover other embodiments, other examples, and equivalents, and alternatives falling within the spirit and scope of the invention as defined by the claims.

The invention claimed is:

1. A photoreactive sensor, comprising:
   a switching transistor;
   a first storage capacitor;
   a driving transistor;
   a second storage capacitor;
   an optical amplification phototransistor that comprises a channel region including a non-overlapping region that does not overlap with a local gate electrode between a source electrode and a drain electrode, wherein the optical amplification phototransistor senses an optical image through the non-overlapping region for amplifying photoconductivity; and
   a contact light emitting device that is formed on the optical amplification phototransistor and generates the optical image corresponding to a contacted surface upon contact with an object,
   wherein the non-overlapping region functions as a photoconductor for amplifying photoconductivity according to decrease of a resistance and increase of a conductivity when light is applied to the non-overlapping region, wherein the non-overlapping region functions as an external series resistor when light is not applied to the non-overlapping region, wherein the contact light emitting device comprises a light emitting layer configured to include barium titanate for increasing luminescence brightness and a black pigment for increasing contrast of the optical image, wherein the optical amplification phototransistor increases an off-current and an on-current by generating a pair of electron holes at the channel region including the non-overlapping region and a region overlapped with the local gate electrode between the source electrode and the drain electrode when the light is applied, and wherein a gate of the switching transistor is connected to a scan line, and a drain of the switching transistor is connected to a data line, a gate of the driving transistor is connected to a source of the switching transistor, the first storage capacitor is connected in parallel to the gate and a source of the driving transistor, a source of the optical amplification phototransistor is connected to the driving transistor, and a drain of the optical amplification phototransistor is connected to the second storage capacitor, the second storage capacitor being connected in parallel to a light source part in order to integrally generate light for outputting image information and light for obtaining photoreactive information.

2. The photoreactive sensor according to claim 1, wherein the contact light emitting device comprises:
a transparent electrode layer connected to one terminal of a power source;
the light emitting layer that is formed on the transparent electrode layer and generates the optical image corresponding to the contacted surface upon contact with an object forming a ground; and
a dielectric layer formed on the light emitting layer.

3. The photoreactive sensor according to claim 1, wherein the non-overlapping region is formed in a lateral direction of each of the source electrode and the drain electrode or in a lateral direction of any one of the source electrode and the drain electrode.

4. The photoreactive sensor according to claim 1, wherein the channel region is formed of a transition metal chalcogen compound (transition metal dichalcogenide).

5. The photoreactive sensor according to claim 4, wherein the transition metal chalcogen compound comprises at least one of molybdenum disulfide ($MoS_2$), molybdenum diselenide ($MoSe_2$), tungsten diselenide ($WSe_2$), molybdenum ditelluride ($MoTe_2$), and tin diselenide ($SnSe_2$).

6. The photoreactive sensor according to claim 1, wherein each of the gate electrode, the source electrode, and the drain electrode comprises at least one of metallic materials and transparent conductive materials,
wherein the transparent conductive material comprises at least one of an amorphous oxide, a crystalline oxide, graphene, and a polymeric organic substance.

7. The photoreactive sensor according to claim 1, wherein the optical amplification phototransistor comprises:
the local gate electrode formed on a substrate;
a gate insulating layer formed on the substrate to cover the local gate electrode;
the source electrode and the drain electrode respectively formed at opposite sides of the gate insulating layer; and
the channel region formed on the gate insulating layer, wherein the non-overlapping region is formed between the source electrode and the drain electrode.

8. A display panel, comprising:
a light source part generating light;
a switching transistor sampling image information corresponding to each pixel;
a first storage capacitor storing the image information;
a driving transistor switching current supply to the light source part by reference voltage of the stored image information;
an optical amplification phototransistor that transmits the switched current supply to the light source part, and senses light generated from the light source part and reflected from a target subject to amplify photoreactivity; and
a second storage capacitor that stores photoreactive information comprising at least one of fingerprint information, contact information, and biometric information of the target subject based on a reactivity degree of the amplified light, wherein the optical amplification phototransistor comprises a channel region including a non-overlapping region that does not overlap with a local gate electrode between a source electrode and a drain electrode, wherein the non-overlapping region functions as a photoconductor for amplifying photoconductivity according to decrease of a resistance and increase of a conductivity when light is applied to the non-overlapping region, wherein the non-overlapping region functions as an external series resistor when light is not applied to the non-overlapping region, wherein the switching transistor is configured to be connected to a scan line and a data line and perform a switching operation, wherein the switching transistor is configured to be provided with predetermined luminance data through the data line and perform a switching operation using a low signal sequentially applied through the scan line, wherein the optical amplification phototransistor increases an off-current and an on-current by generating a pair of electron holes at the channel region including the non-overlapping region and a region overlapped with the local gate electrode between the source electrode and the drain electrode when the light is applied, and wherein a gate of the switching transistor is connected to a scan line, and a drain of the switching transistor is connected to a data line, a gate of the driving transistor is connected to a source of the switching transistor, the first storage capacitor is connected in parallel to the gate and a source of the driving transistor, a source of the optical amplification phototransistor is connected to the driving transistor, and a drain of the optical amplification phototransistor is connected to the second storage capacitor, the second storage capacitor being connected in parallel to the light source part in order to integrally generate light for outputting the image information and light for obtaining the photoreactive information.

9. The display panel according to claim 8, wherein the non-overlapping region is disposed between the source electrode and the drain electrode and the optical amplification phototransistor senses the reflected light through the non-overlapping region that amplifies photoconductivity.

10. The display panel according to claim 8, wherein the biometric information comprises information on a tissue or a function related to at least any one of melanin pigment concentration, hemoglobin concentration, pulse and an oxygen saturation degree.

11. The display panel according to claim 8, wherein the biometric information comprises information on a tissue and a function related to at least any one of temperature and humidity of a skin tissue.

12. A display panel, comprising:
a light source part that generates light to acquire photoreactive information comprising at least one of fingerprint information, contact information, and biometric information of a target subject;
a switching transistor that samples image information corresponding to each pixel;
a first storage capacitor that stores the image information;
a driving transistor that switches current supply to an illuminant by reference voltage of the stored image information;
an optical amplification phototransistor that transmits the switched current supply to the illuminant, and senses light generated from the light source part and reflected from the target subject to amplify photoreactivity; and
a second storage capacitor that stores the photoreactive information based on a reactivity degree of the amplified light,
wherein the optical amplification phototransistor comprises a channel region including a non-overlapping region that does not overlap with a local gate electrode between a source electrode and a drain electrode,
wherein the non-overlapping region functions as a photoconductor for amplifying photoconductivity according to decrease of a resistance and increase of a conductivity when light is applied to the non-overlapping region,
wherein the non-overlapping region functions as an external series resistor when light is not applied to the non-overlapping region,
wherein the switching transistor is configured to be connected to a scan line and a data line and perform a switching operation,
wherein the switching transistor is configured to be provided with predetermined luminance data through the data line and perform a switching operation using a low signal sequentially applied through the scan line,
wherein the optical amplification phototransistor increases an off-current and an on-current by generating a pair of electron holes at the channel region including the non-overlapping region and a region overlapped with the local gate electrode between the source electrode and the drain electrode when the light is applied, and
wherein a gate of the switching transistor is connected to a scan line, and a drain of the switching transistor is connected to a data line, a gate of the driving transistor is connected to a source of the switching transistor, the first storage capacitor is connected in parallel to the gate and a source of the driving transistor, a source of the optical amplification phototransistor is connected to the driving transistor, and a drain of the optical amplification phototransistor is connected to the second storage capacitor, the second storage capacitor being connected in parallel to the light source part in order to integrally generate light for outputting the image information and light for obtaining the photoreactive information.

13. A display panel, comprising:
a light source part that comprises a transparent electrode layer connected to one terminal of a power source, a light emitting layer that is formed on the transparent electrode layer and generates light to correspond to a contacted surface upon contact with a target subject forming a ground, and a dielectric layer formed on the light emitting layer; and
a photoreactive sensor that comprises a switching transistor sampling image information corresponding to each pixel, a first storage capacitor storing the image information, a driving transistor switching current supply to the light source part by reference voltage of the stored image information, an optical amplification phototransistor that transmits the switched current supply, and senses light generated from the light source part and reflected from the target subject to amplify photoreactivity, and a second storage capacitor that stores photoreactive information comprising at least one of fingerprint information, contact information, and biometric information of the target subject based on a reactivity degree of the amplified light,
wherein the optical amplification phototransistor comprises a channel region including a non-overlapping region that does not overlap with a local gate electrode between a source electrode and a drain electrode,
wherein the non-overlapping region functions as a photoconductor for amplifying photoconductivity according to decrease of a resistance and increase of a conductivity when light is applied to the non-overlapping region,
wherein the non-overlapping region functions as an external series resistor when light is not applied to the non-overlapping region,
wherein the switching transistor is configured to be connected to a scan line and a data line and perform a switching operation,
wherein the switching transistor is configured to be provided with predetermined luminance data through the data line and perform a switching operation using a low signal sequentially applied through the scan line,
wherein the optical amplification phototransistor increases an off-current and an on-current by generating a pair of electron holes at the channel region including the non-overlapping region and a region overlapped with the local gate electrode between the source electrode and the drain electrode when the light is applied, and
wherein a gate of the switching transistor is connected to a scan line, and a drain of the switching transistor is connected to a data line, a gate of the driving transistor is connected to a source of the switching transistor, the first storage capacitor is connected in parallel to the gate and a source of the driving transistor, a source of the optical amplification phototransistor is connected to the driving transistor, and a drain of the optical amplification phototransistor is connected to the second storage capacitor, the second storage capacitor being connected in parallel to the light source part in order to integrally generate light for outputting the image information and light for obtaining the photoreactive information.

14. A vehicle control system, comprising:
an acquisition part that comprises an optical amplification phototransistor formed on at least one of a door, a trunk, a handle, a display, a start button, a smart key, and a predetermined position of a vehicle, senses and amplifies light reflected from a target object based on the optical amplification phototransistor, and acquires photoreactive information comprising at least one of fingerprint information, contact information, and biometric information of the target object based on a reactivity degree of the amplified light;

a control command generator that generates a control command by analyzing the acquired photoreactive information; and a controller that controls generation of the control command and controls an electronic unit performing an operation corresponding to the generated control command, wherein the optical amplification phototransistor comprises a channel region including a non-overlapping region that does not overlap with a local gate electrode between a source electrode and a drain electrode, wherein the non-overlapping region functions as a photoconductor for amplifying photoconductivity according to decrease of a resistance and increase of a conductivity when light is applied to the non-overlapping region, wherein the non-overlapping region functions as an external series resistor when light is not applied to the non-overlapping region, wherein the acquisition part comprises a switching transistor configured to be connected to a scan line and a data line and perform a switching operation, wherein the switching transistor is configured to be provided with predetermined luminance data through the data line, and perform a switching operation using a low signal sequentially applied through the scan line, wherein the optical amplification phototransistor increases an off-current and an on-current by generating a pair of electron holes at the channel region including the non-overlapping region and a region overlapped with the local gate electrode between the source electrode and the drain electrode when the light is applied, and wherein the acquisition part comprises a light source part, a switching transistor, a first storage capacitor, a driving transistor, the optical amplification phototransistor and a second storage capacitor, a gate of the switching transistor is connected to a scan line, and a drain of the switching transistor is connected to a data line, a gate of the driving transistor is connected to a source of the switching transistor, the first storage capacitor is connected in parallel to the gate and a source of the driving transistor, a source of the optical amplification phototransistor is connected to the driving transistor, and a drain of the optical amplification phototransistor is connected to the second storage capacitor, the second storage capacitor being connected in parallel to the light source part in order to integrally generate light for outputting the image information and light for obtaining the photoreactive information.

15. The vehicle control system according to claim 14, wherein the optical amplification phototransistor comprises the source electrode and the drain electrode, and senses the reflected light through the non-overlapping region amplifying photoconductivity.

16. The vehicle control system according to claim 14, wherein the acquisition part comprises:

the light source part that generates light;

the switching transistor that samples the image information corresponding to each pixel;

the first storage capacitor that stores the image information;

the driving transistor that switches current supply to at least one of the light source part and an illuminant by reference voltage of the stored image information;

the optical amplification phototransistor that transmits the switched current supply to at least one of the light source part and the illuminant, and senses light generated from the light source part and reflected from the target object to amplify photoreactivity; and the second storage capacitor that acquires the photoreactive information on the amplified light.

17. The vehicle control system according to claim 16, wherein at least one of the light source part and the illuminant is formed on a lower part of a backplane based on a backlight method, and comprises at least one of a halogen, a Quantum Dot (QD), a light emitting diode (LED), and an Organic Light Emitting Diode (OLED).

18. The vehicle control system according to claim 16, wherein the light source part generates light radiated to a photoreactive region when the current supply to the illuminant is switched, and the optical amplification phototransistor senses the light reflected from the target object located on the photoreactive region to amplify the photoreactivity.

19. The vehicle control system according to claim 16, wherein the light source part comprises:

a transparent electrode layer that is connected to one terminal of a power source;

a light emitting layer that is formed on the transparent electrode layer and generates light to correspond to the contacted surface upon contact of the target object forming a ground; and a dielectric layer that is formed on the light emitting layer.

* * * * *